(12) United States Patent
Nakasugi

(10) Patent No.: US 6,762,421 B2
(45) Date of Patent: Jul. 13, 2004

(54) CHARGED PARTICLE BEAM EXPOSURE APPARATUS AND EXPOSURE METHOD

(75) Inventor: Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 10/092,161

(22) Filed: Mar. 7, 2002

(65) Prior Publication Data

US 2002/0127484 A1 Sep. 12, 2002

(30) Foreign Application Priority Data

Mar. 9, 2001 (JP) ........................................ 2001-067229

(51) Int. Cl.$^7$ ............................................ H01J 37/304
(52) U.S. Cl. ............................. 250/491.1; 250/492.22
(58) Field of Search ...................... 250/491.1, 492.22, 250/492.2

(56) References Cited

U.S. PATENT DOCUMENTS

| 5,939,725 A | * | 8/1999 | Muraki .................. 250/492.22 |
| 5,989,759 A | | 11/1999 | Ando et al. |
| 6,147,355 A | | 11/2000 | Ando et al. |
| 6,376,136 B1 | * | 4/2002 | Nakasugi et al. ............. 430/22 |
| 6,512,237 B2 | * | 1/2003 | Nakasugi et al. ......... 250/491.1 |

FOREIGN PATENT DOCUMENTS

| JP | 05-047649 | 2/1993 |
| JP | 2865164 | 12/1998 |
| JP | 2960746 | 7/1999 |

OTHER PUBLICATIONS

Ando, A. et al., "A Pattern Forming Method", U.S. application Ser. No.: 09/670,098, filed on Sep. 26, 2000.
Nakasugi, T. et al., "Charged Beam Exposure Method and Charged Beam Exposure Apparatus", U.S. application Ser. No. 09/465,932, filed on Dec. 17, 1999.
Nakasugi, T. et al., "Pattern Observation Apparatus and Pattern Observation Method", U.S. application Ser. No. 09/669,732, filed on Sep. 26, 2000.

* cited by examiner

Primary Examiner—Jack Berman
(74) Attorney, Agent, or Firm—Finnegan, Henderson, Farabow, Garrett & Dunner, L.L.P.

(57) ABSTRACT

A charged particle beam exposure apparatus comprises a beam gun, a projection optics, a sample stage loaded with a sample wherein an image projected from the projection optics is to be formed, first marks are formed beforehand, and second marks are exposed to a charged particle beam with a first incident energy by the projection optics in the vicinity of the first marks, a detector detecting an electron signal from a region including the first and second marks, when the region is scanned with a second incident energy different from the first incident energy, a calculation circuit calculating a positional shift between the first and second marks from the detected signal, a correction circuit correcting a position of the first mark based on the calculated positional shift, and an exposure control circuit aligning a desired pattern based on the corrected position of the first mark.

10 Claims, 20 Drawing Sheets

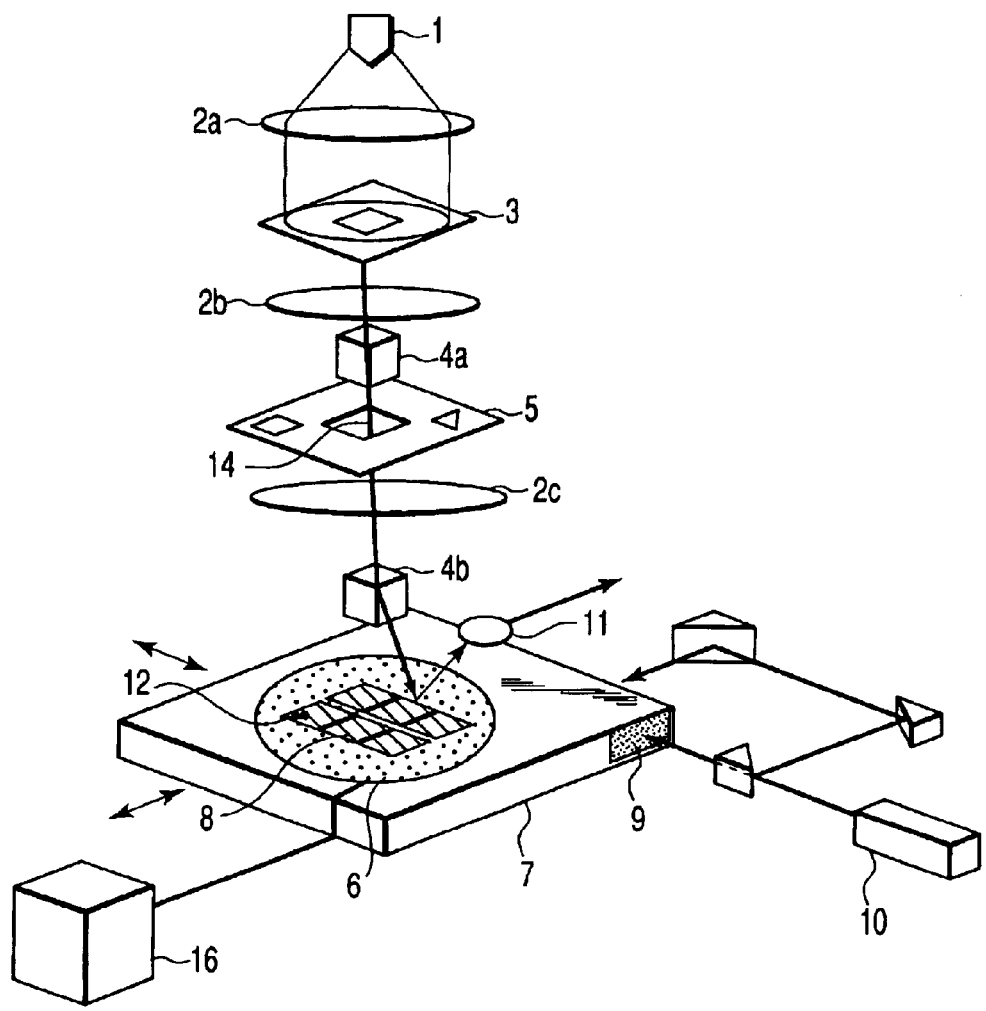
F I G. 3A

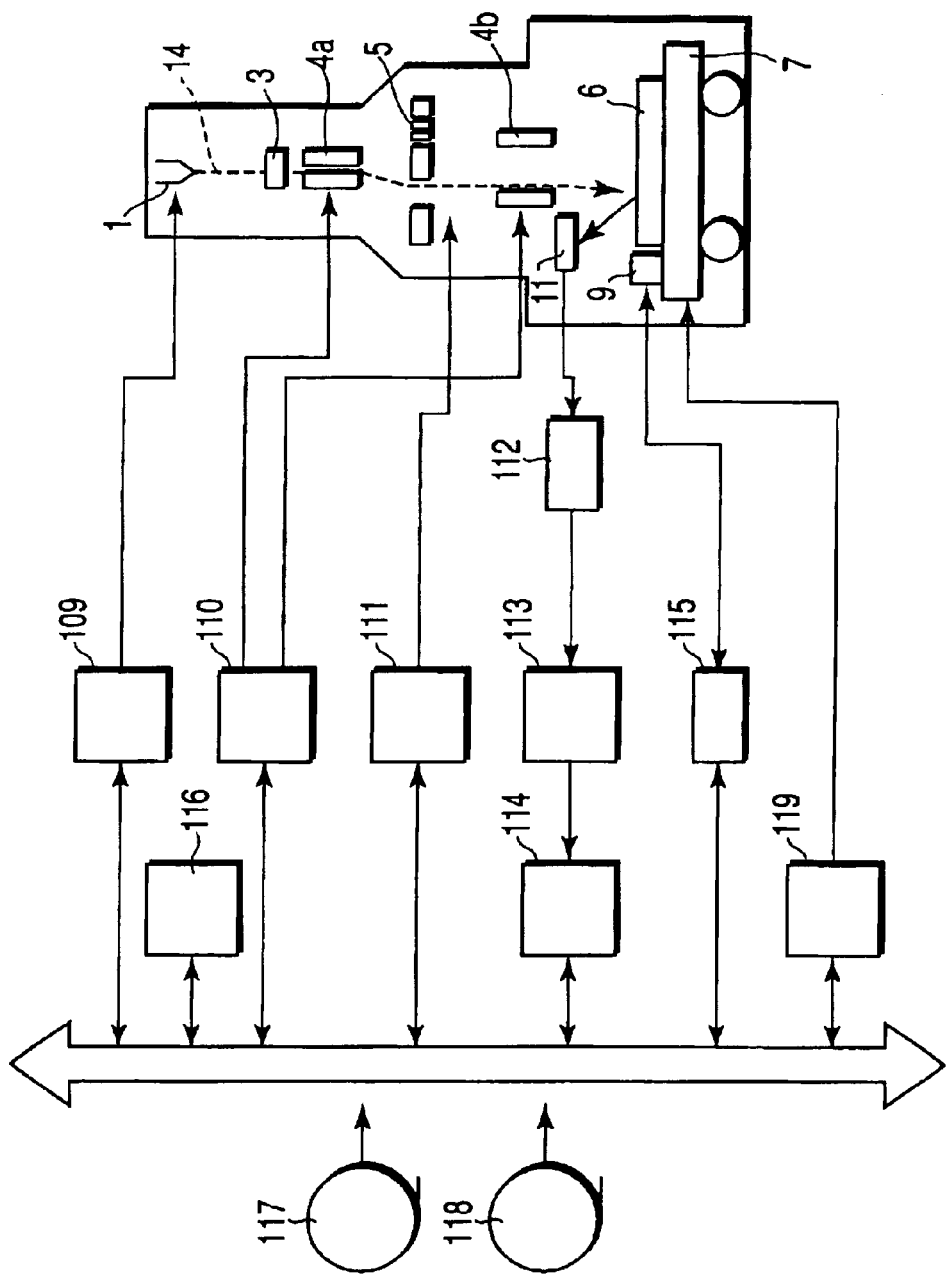
F I G. 3B

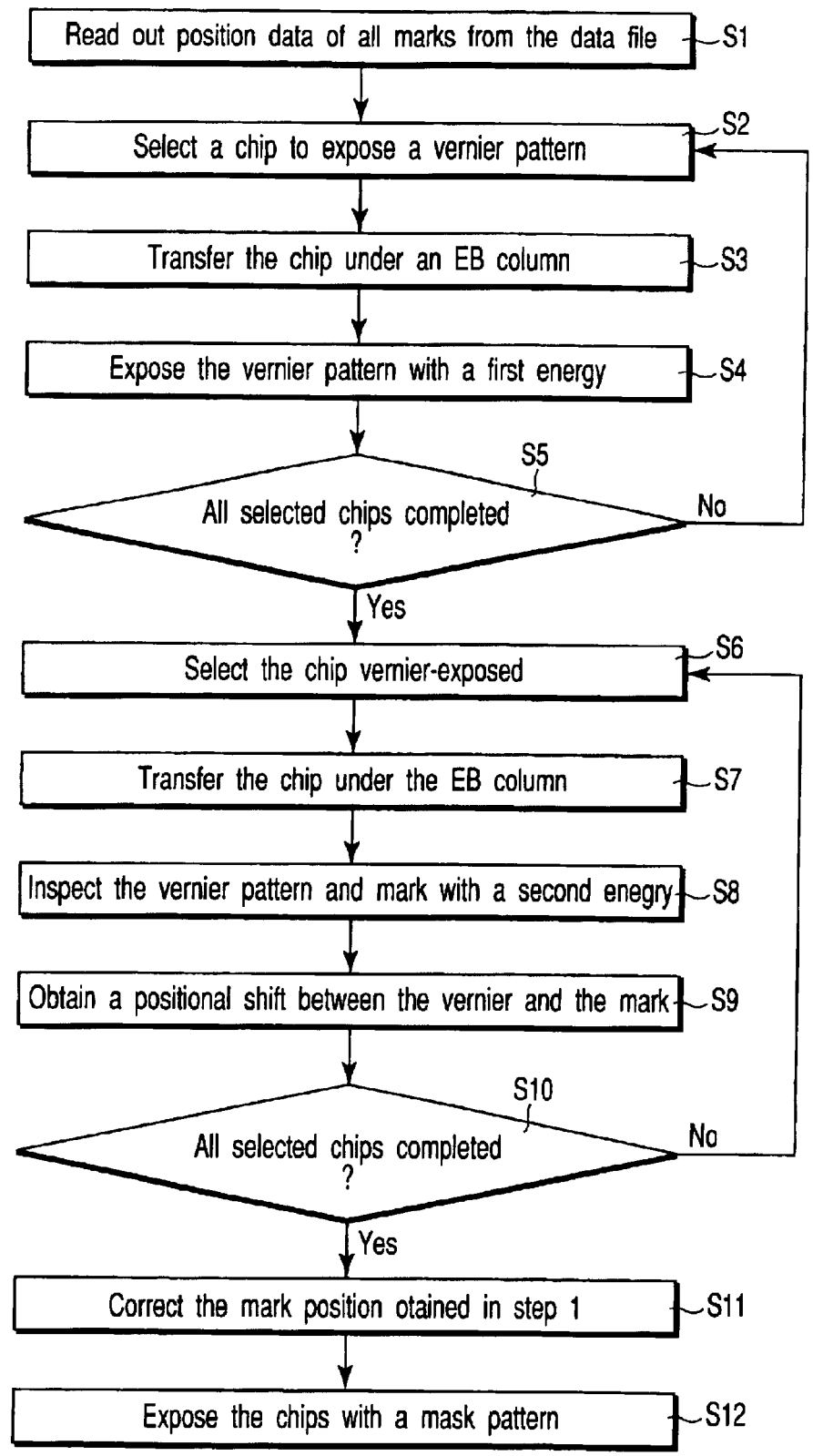
F I G. 6

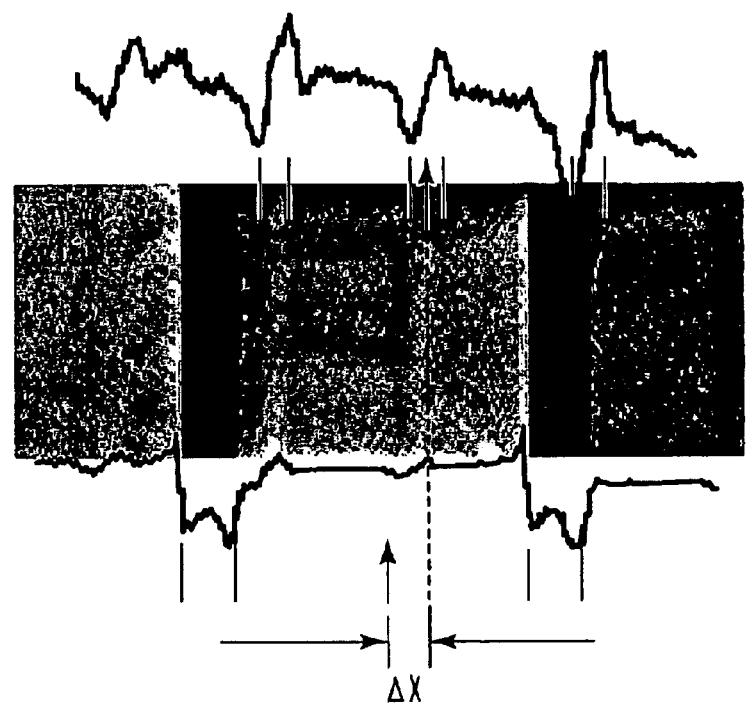
F I G. 7
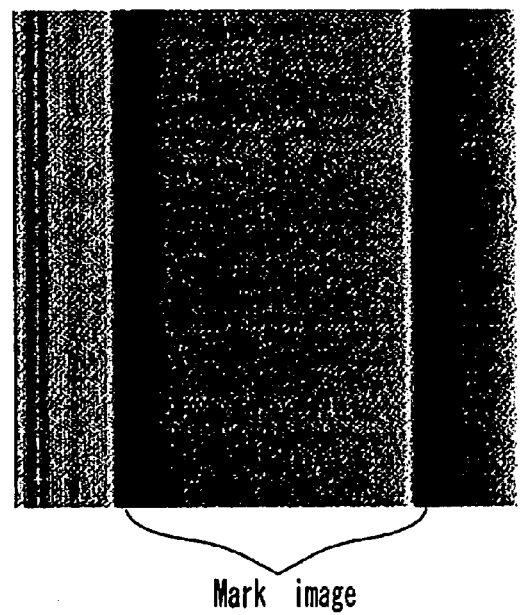
Mark image
F I G. 9B

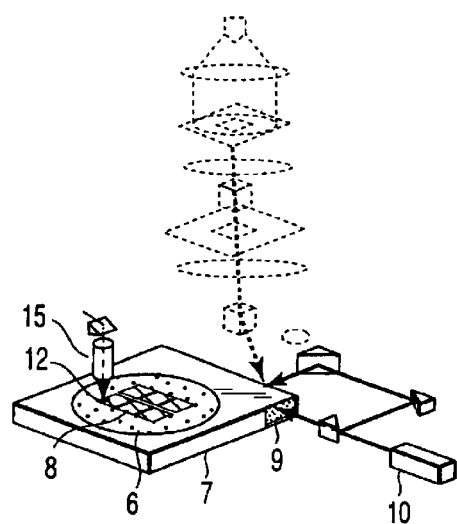
F I G. 12A
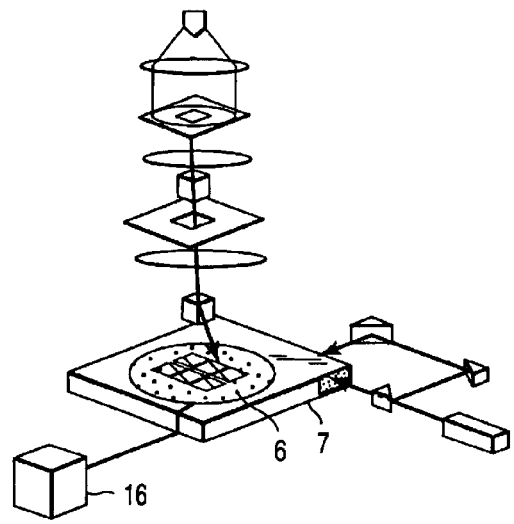
F I G. 12C
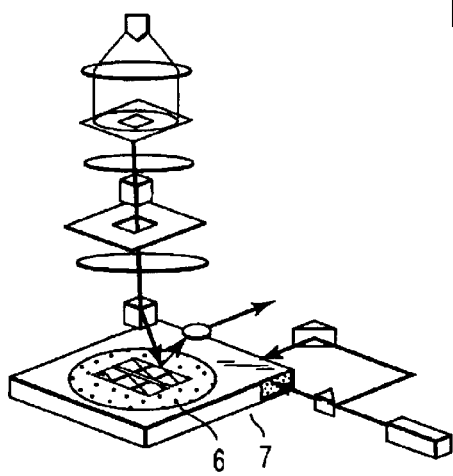
F I G. 12B
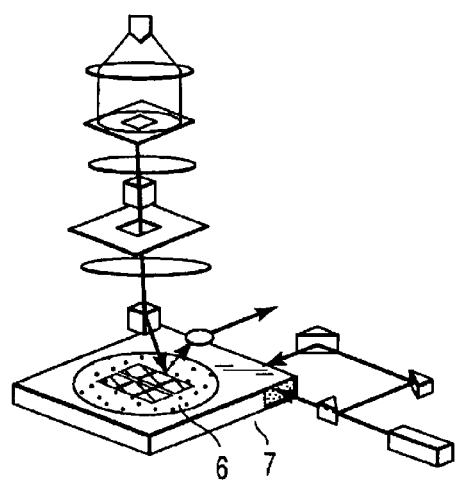
F I G. 12D

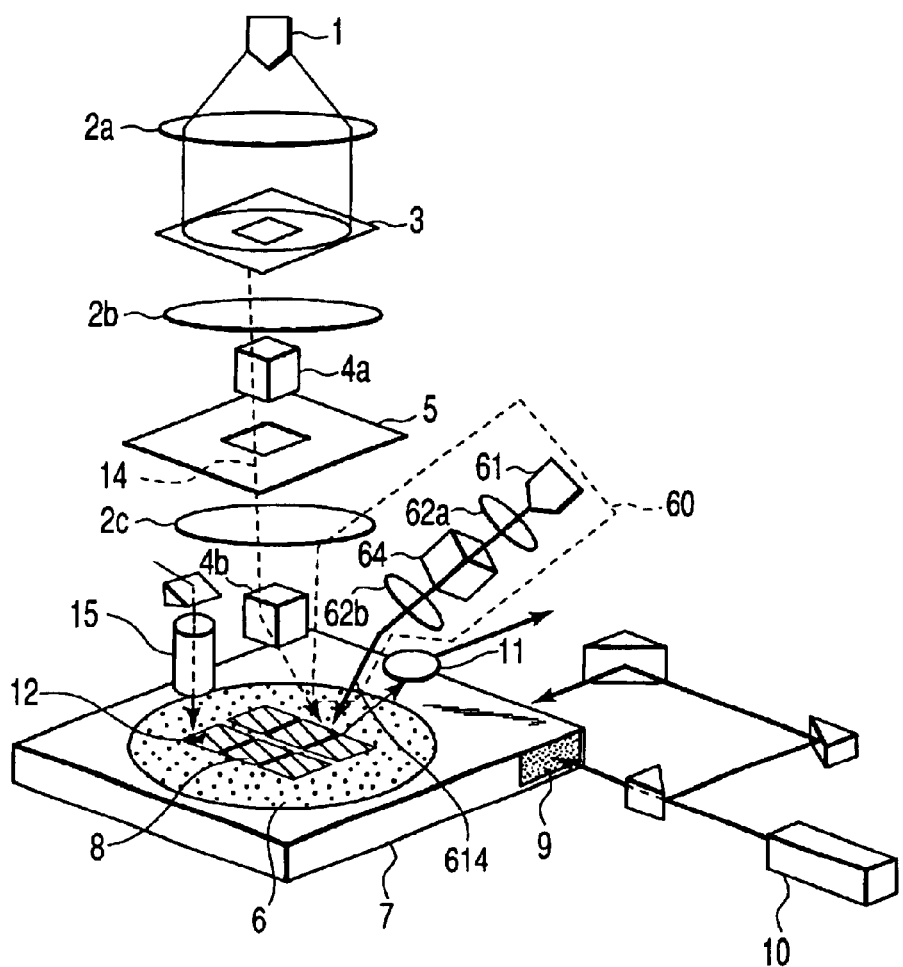
F I G. 14

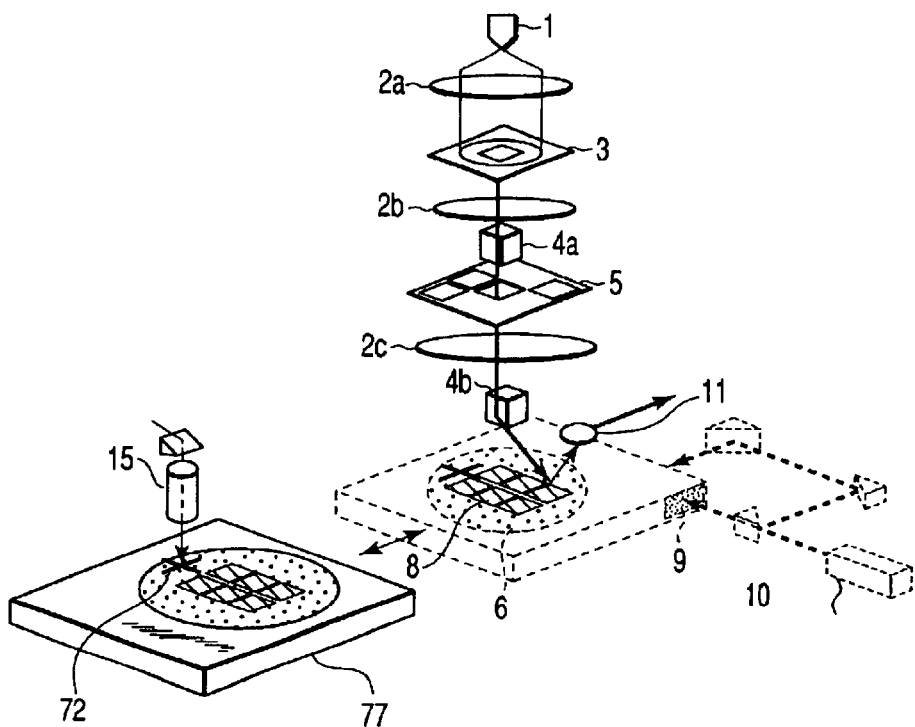
F I G. 16A
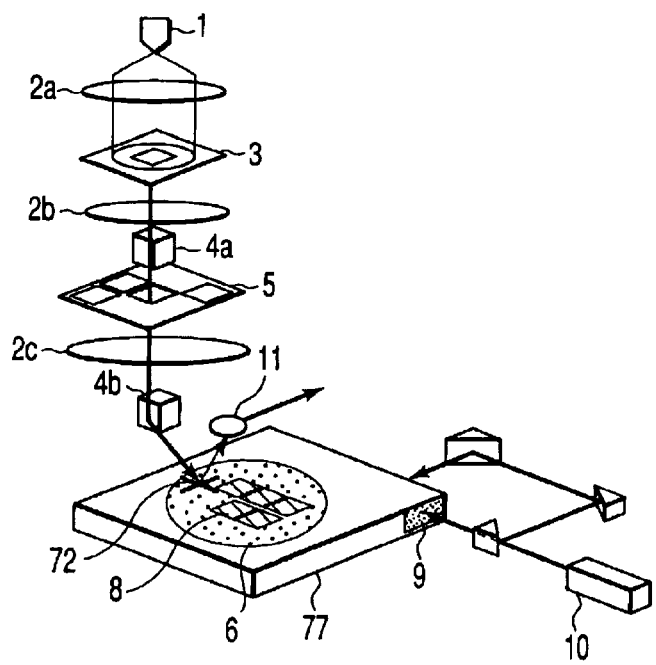
F I G. 16B

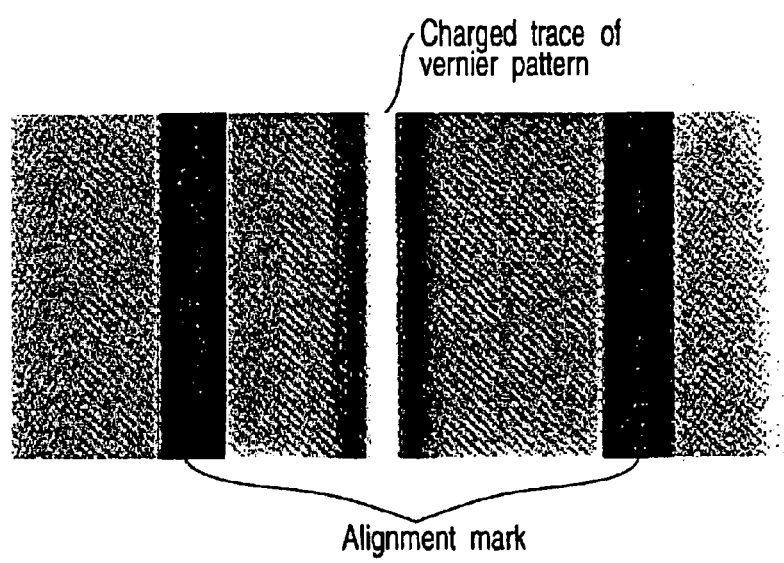
F I G. 22

CHARGED PARTICLE BEAM EXPOSURE APPARATUS AND EXPOSURE METHOD

CROSS-REFERENCE TO RELATED APPLICATIONS

This application is based upon and claims the benefit of priority from the prior Japanese Patent Application No. 2001-067229, filed Mar. 9, 2001, the entire contents of which are incorporated herein by reference.

BACKGROUND OF THE INVENTION

1. Field of the Invention

The present invention relates to a charged particle beam exposure technique for forming a desired pattern on a sample, particularly to a charged particle beam exposure apparatus and exposure method in which a mark formed on a sample is used to adjust positions.

2. Description of the Related Art

An electron beam exposure apparatus shown in FIG. 1 has heretofore been used as an apparatus for forming an LSI pattern on a semiconductor wafer. In FIG. 1, a reference numeral 1 denotes an electron gun, 2a to 2c denote lenses, 3 denotes a first aperture, 4a, 4b denote deflectors, 5 denotes a second aperture, 6 denotes a wafer, 7 denotes a stage, 8 denotes a chip, 9 denotes a mirror, 10 denotes a laser interferometer, 11 denotes a detector, 12 denotes an alignment mark, 13 denotes a reflected electron, and 14 denotes an electron beam. Additionally, in many cases, the deflector 4a for use in selecting a beam position of the second aperture 5 is disposed above and below the second aperture 5 to deflect a beam from an optical axis, and to return the deflected beam to the optical axis, but it is shown here in a simple manner, i.e. only above the second aperture 5.

In the apparatus, when the pattern is exposed on the wafer 6, a relative position of the pattern on the wafer 6 with an optics needs to be adjusted. A method for this adjustment includes: using the mirror 9 and laser interferometer 10 to constantly monitor the position of the stage 7; scanning the alignment mark 12 formed for each chip 8 on the wafer 6 with the electron beam 14; detecting the reflected electron 13 from the mark 12 by the detector 11; and measuring the position of the mark 12.

However, this type of method has the following problems. That is, since the mark is detected for each mark 8 on the wafer 6, as shown by arrows in FIG. 2A, a frequency of stage movement 20 increases. As a result, an exposure throughput decreases. Moreover, by an electron beam scanning 21, a resist on the mark 12 is excessively exposed to light, an insoluble region 22 is generated, and this causes dust generation.

As described above, in the conventional alignment in the electron beam exposure, since the frequency of the stage movement increases, the throughput decreases. Moreover, another problem is that the resist on the mark is excessively exposed to the electron beam scanned for the alignment, the dust generation is caused, and an alignment precision is deteriorated.

Therefore, it has been necessary to realize a charged particle beam exposure apparatus and exposure method in which a resist can be prevented from being excessively exposed to the beam scanned for the alignment, and a throughput and the alignment precision can be enhanced.

BRIEF SUMMARY OF THE INVENTION

According to a first aspect of the present invention, there is provided a charged particle beam exposure apparatus, comprising:

a beam gun which emits a charged particle beam;

a projection optics which shapes the charged particle beam and projects a desired pattern;

an incident energy control circuit which controls an incident energy of the projection optics;

a sample stage loaded with a sample in which an image projected from the projection optics is to be formed, a plurality of first marks are formed beforehand, and a plurality of second marks are exposed to the charged particle beam with a first incident energy by the projection optics in the vicinity of the plurality of first marks;

a detector to detect an electron signal generated from a region including the plurality of first marks and the plurality of second marks, when the region is scanned with a second incident energy different from the first incident energy;

a calculation circuit which calculates a positional shift amount between the plurality of first marks and the plurality of second marks from the detected electron signal;

a correction circuit which corrects positions of the plurality of first marks on the sample based on the calculated positional shift amount; and an exposure control circuit which aligns the desired pattern based on the corrected positions of the plurality of first marks.

According to a second aspect of the present invention, there is provided a charged particle beam exposure method comprising:

exposing a second mark on a sample to a charged particle beam with a first incident energy based on a position of a first mark formed on the sample beforehand;

scanning a region including the first mark and the second mark with a second incident energy by the charged particle beam;

detecting an electron signal generated from the sample by the scanning;

calculating a positional shift amount of the first mark and the second mark from the detected electron signal;

correcting the position of the first mark on the sample based on the calculated positional shift amount; and aligning and exposing a desired pattern based on the corrected position of the first mark.

BRIEF DESCRIPTION OF THE SEVERAL VIEWS OF THE DRAWING

FIG. 3A is a schematic configuration diagram showing an electron beam exposure apparatus according to a first embodiment of the present invention.

FIG. 3B is a block diagram showing a control system of the exposure apparatus of FIG. 3A.

FIG. 6 is a flowchart of an alignment method in the first embodiment.

FIG. 7 is an explanatory view showing a voltage contrast image of an alignment mark pattern and vernier pattern, and an obtained positional shift amount.

FIG. 9B is a photograph showing a contrast state in which an incident energy is 3 keV in FIG. 9A.

FIGS. 12A to 12D are diagrams showing the movement of the main part of the exposure apparatus in the course of the alignment in the second embodiment.

FIG. 14 is a schematic configuration diagram showing the electron beam exposure apparatus according to a third embodiment.

FIGS. 16A and 16B are diagrams showing the schematic configuration and exposure method of the electron beam exposure apparatus according to the modification example of the fourth embodiment.

FIG. 22 is a photograph for a view showing an alignment mark image and voltage contrast image by a charged trace of the vernier pattern.

DETAILED DESCRIPTION OF THE INVENTION

Figure 1:
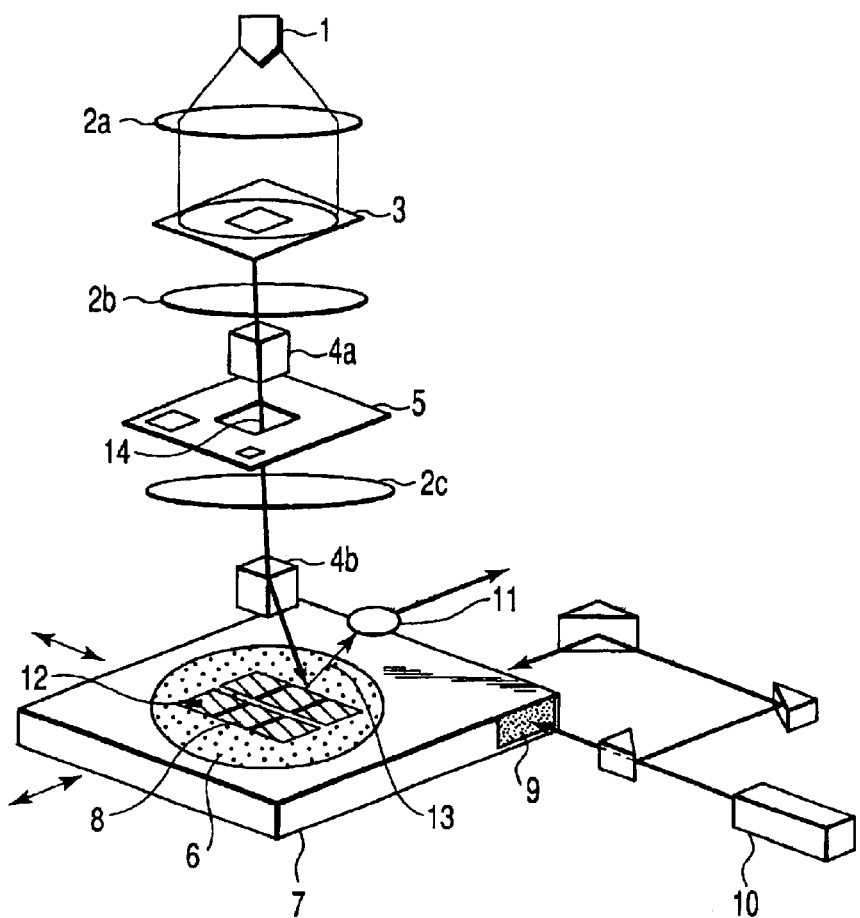
FIG. 1 is a schematic configuration diagram showing a conventional electron beam exposure apparatus.
Figure 2A:
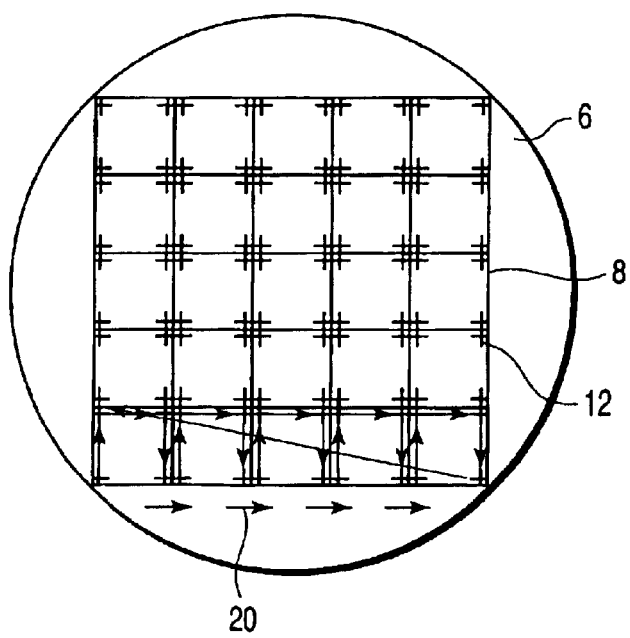
FIG. 2A is an explanatory view showing a problem of increased stage movement in a conventional exposure method.
Figure 2B:
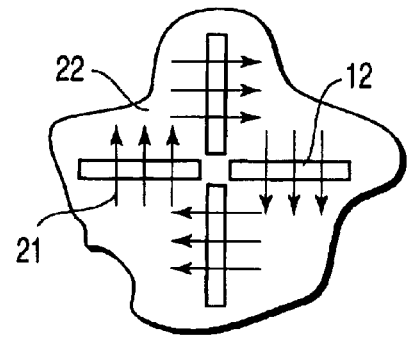
FIG. 2B is an explanatory view showing a problem of insolubility of a resist in the conventional exposure method.

An outline of the present invention will be described prior to description of embodiments. In the present invention, an electron beam exposure system, and the like are used to expose a second mark (vernier pattern, and the like formed on a resist on a wafer) based on position information of a first mark disposed on the wafer, a positional shift between the vernier pattern and an alignment pattern (first mark) is measured, and the positional shift is corrected, so that the exposure with a high-precision alignment is realized.

Moreover, positions of only some of the alignment marks formed on the wafer are detected, global alignment is performed, and other mark positions are calculated, so that a time required for the mark detection can be reduced as compared with a conventional method. As a result, a productivity in electron beam exposure can be enhanced.

Furthermore, a second incident energy for measuring the positional shift is set to be smaller than a first incident energy for forming the vernier pattern. Therefore, when a resist surface is scanned with a beam with the second incident energy, a latent image in the resist exposed with the first incident energy, that is, the vernier pattern is prevented from being superposed and exposed, and the latent image can therefore be detected with a high precision. As a result, it is possible to highly precisely measure a positional shift amount between the alignment mark and the vernier pattern, and further the alignment exposure can be realized with the high precision.

Particularly, when the second incident energy is set to 3 keV or less, only about 0.3 $\mu$m from the surface is exposed with a several micrometers thick insulator film on the mark. Therefore, the insulator film surface can effectively be charged. Moreover, when a range of the charging beam having the second incident energy is set to be smaller than the resist film thickness, there is no fear that the pattern exposed with the first incident energy is superposed and exposed in a depth direction. Moreover, when a bias voltage is applied to a sample in a method for changing the first and second incident energies, an electron gun and electron beam optics for the exposure, and an optics for detecting the positions of the latent image and alignment mark can be used in common. As a result, an apparatus configuration can be simplified.

Additionally, a characteristic of the present invention lies in that the positional shift between the vernier pattern and the alignment pattern is measured by scanning the resist surface with the charging beam having a relatively low energy. This principle will briefly be described.

A sample whose surface is formed of an insulating material is scanned with the charging beam having a low energy, and the insulating material surface is charged. In this case, a potential distribution with a sectional structure of the sample reflected therein is formed on the sample surface. On the other hand, a generation efficiency of a secondary electron generated by scanning the charging beam changes with the surface potential distribution. As a result, when the sample having the surface formed of the insulating material is scanned with the charging beam having the low energy, it is possible to obtain a secondary electron signal (voltage contrast image) with the sectional structure of the sample reflected therein.

Moreover, when a chemical, electrical, or physical change is generated in the resist by the exposure, the surface potential distribution can be formed. For example, when a conductivity of the resist is changed by the exposure, the secondary electron signal obtained by scanning the resist surface with the charging beam having the low energy indicates different intensities in an exposed/unexposed portion. As a result, it is possible to obtain the voltage contrast image corresponding to the exposed/unexposed portion of the resist.

Embodiments of the present invention will be described hereinafter with reference to the drawings.

First Embodiment

FIG. 3A is a schematic configuration diagram showing an electron beam exposure apparatus according to a first embodiment of the present invention, and FIG. 3B is a block diagram showing a control system of the apparatus. The present apparatus is an electron beam exposure apparatus of a variable shaped and character projection type with an acceleration energy of 5 keV. One characteristic of the present invention lies in that the conventional acceleration energy of about 50 keV is changed to a low energy of 1 to 8 keV. Functions of respective components will be described hereinafter.

As shown in FIG. 3A, an electron beam 14 discharged from an electron gun 1 is emitted onto a first aperture 3 by a capacitor lens 2a. The electron beam 14 transmitted through the first aperture 3 is projected onto a second aperture 5 by a projection lens 2b. The first aperture 3 has a rectangular opening, and the second aperture 5 has a character opening to form a repeated pattern in addition to the rectangular opening. A shaping deflector 4a deflects the electron beam 14 in an arbitrary position on the second aperture 5, so that a desired beam shape is realized.

A wafer (sample) 6 on a stage (sample base) 7 is irradiated with the electron beam 14 transmitted through the second aperture 5 by a reduction and objective lens 2c. In this case, the electron beam 14 on the wafer 6 is positioned by an objective deflector 4b.

Additionally, in many cases, the deflector 4a for use in selecting the beam position on the second aperture 5 is disposed above and below the second aperture 5 in order to deflect the beam from an optical axis and return the deflected beam to the optical axis. However, only the upper deflector is shown here for the sake of simplicity.

Mirrors 9 are disposed on two side surfaces of the stage 7 loaded with the wafer 6, and a laser interferometer 10 for irradiating these mirrors 9 with laser beams is disposed. The laser interferometer 10 constantly measures the position of the stage 7. Moreover, an electron detector 11 is disposed opposite to the wafer 6. Furthermore, a reflected and a secondary electron signals generated when an alignment mark 12 formed on the wafer 6 scanned with the electron beam are detected by the detector 11.

The configuration described above is basically similar to that of the conventional apparatus, but the following characteristic configuration is added to the first embodiment. That is, the characteristic of the present apparatus lines in that a sample power supply 16 for applying the voltage to the wafer 6 via the stage 7 is disposed. Thereby, for example, when a voltage of −4 kV is applied to the wafer 6, the incident energy to the wafer 6 can be set to a low energy of about 1 keV.

The control system of the exposure apparatus according to the first embodiment will next be described with reference to FIG. 3B. The same components as those of FIG. 3A are denoted with the same reference numerals and redundant description is omitted. In FIG. 3B, a reference numeral 109 denotes a beam control circuit, 110 denotes a beam position/shape control circuit, 111 denotes a lens control circuit, 112 denotes a detection amplifier, 113 denotes a calculation circuit, 114 denotes a correction circuit, 115 denotes a stage (sample base) control circuit, 116 denotes an exposure control circuit, and 119 denotes an incident energy control circuit. Additionally, the lenses are omitted from FIG. 3B.

The beam control circuit 109 turns on/off the electron beam 14 based on a command of the exposure control circuit 116. The beam position/shape control circuit 110 controls the deflector 4a to determine an electron beam shape, and controls the deflector 4b to position the electron beam 14 in a desired position on the wafer 6 based on the command of the exposure control circuit 116. The lens control circuit 111 controls the voltage of the lens (not shown) based on the command of the exposure control circuit 116, and projects the electron beam 14 with a reduced size onto the wafer 6. The stage control circuit 115 moves the stage 7 to the desired position based on the command of the exposure control circuit 116. The incident energy control circuit 119 controls the incident energy of the electron beam 14 incident upon the wafer 6 based on the command of the exposure control circuit 116.

As described above, the electron beam 14 discharged from the electron gun 1 is shaped by the first aperture 3. Furthermore, the electron beam 14 passed through the first aperture 3 is emitted to the desired position on the second aperture 5 by the deflector 4a. Openings (not shown) having various shapes are formed in the second aperture 5. The deflector 4a aligns the electron beam 14 with the desired opening on the second aperture 5. Thereby, the electron beam 14 passed through the second aperture 5 is shaped in a desired shape. The electron beam 14 passed through the second aperture 5 is projected in the reduced size onto the wafer 6 by the lens system (not shown). In this case, the deflector 4b positions the electron beam 14 in the desired position on the wafer 6, so that the position is irradiated.

During exposure, the exposure control circuit 116 controls the electron gun 1, beam control circuit 109, beam position shape control circuit 110, lens control circuit 111, and stage control circuit 115 to perform the exposure based on inputted wafer layout information 118 and drawing data 117.

A control procedure using the control system constituted as described above will be described hereinafter.

A) The exposure control circuit 116 reads positions of a plurality of alignment marks (first marks) to be detected on the wafer 6 from the wafer layout information 118. Subsequently, the exposure control circuit 116 issues a command to the stage control circuit 115 and moves the stage 7. Thereby, the first mark on the wafer 6 is positioned in a range which can be exposed to the electron beam.

B) Subsequently, the exposure control circuit 116 exposes the second mark having a predetermined shape to the first incident energy in a predetermined position in the vicinity of the first mark. In this case, it is meant by the predetermined position in the vicinity of the first mark that a position relation between the first and second marks is predetermined and the marks are exposed with the predetermined relation. In this case, the exposure control circuit 116 stores a deflected position of the electron beam 14 and a stage position.

C) Then, the incident energy control circuit 119 is used to change the first incident energy to the second incident energy, and scans the region including the first and second marks by the electron beam 14 with the second incident energy. A secondary electron generated by the scanning is detected by the detector 11. The secondary electron signal detected by the detector 11 is amplified by the detection amplifier 112, and transmitted as an image signal or a waveform signal to the positional shift amount calculation circuit 113. The positional shift amount calculation circuit 113 calculates the positional shift amount between the first and second marks from the transmitted image or waveform signal. The calculated positional shift amount between the first and second marks is stored by the exposure control circuit 116.

D) The abovementioned steps A) to C) are performed for the number of all the first marks on the wafer 6 to be detected.

E) When the steps A) to D) end, with respect to the plurality of first marks to be detected, the exposure control circuit 116 stores (a) the positional shift amount between the first and second marks calculated by the calculation circuit 113 and (b) the stage positions and beam deflected positions when the respective first and second marks are exposed. The exposure control circuit 116 transmits these data (a), (b), and (c) the position relation of the first and second marks in design to the correction circuit 114. The correction circuit 114 uses the transmitted data (a), (b) and (c) to calculate a correction amount (d) of a position in which the second mark is exposed with respect to the designed position relation (c). The correction amount is calculated with respect to all the first marks on the wafer 6 to be detected. Thereby, the correction amount (d) corresponding to a plurality of positions on the wafer 6 can be obtained. The correction circuit 114 calculates a function equation of the correction amount of a beam position with respect to the position (X, Y) on the wafer 6 from the calculated correction amount (d) corresponding to the plurality of positions on the wafer 6 in order to align the beam with the first mark on the wafer.

F) During drawing, the exposure control circuit 116 controls the electron gun 1, beam control circuit 109, beam position shape control circuit 110, lens control circuit 111, and stage control circuit 115 to perform the exposure based on the inputted wafer layout information 118 and drawing data 117. In this case, the exposure control circuit 116 uses the function equation of the correction amount of the beam position with respect to the calculated position (X, Y) on the wafer 6 to correct the beam position (X, Y) on the wafer 6 and perform the exposure.

Additionally, in the step E), the correction circuit 114 calculates the function equation of the correction amount of the beam position with respect to the position (X, Y) on the wafer 6 from the calculated correction amount (d) corresponding to the plurality of positions on the wafer 6 in order to align the beam with the first mark on the wafer 6. However, another method may also be used. For example, in order to align the beam with the first mark on the wafer 6, a function equation of the correction amount of the stage position with respect to the position (X, Y) on the wafer 6 may also be calculated.

Moreover, in the above description, the exposure of the second mark in the step B, and the electron beam scanning by the second incident energy in the step C are alternately performed, but another order may also be used. For example, after the second mark is exposed to the first incident energy with respect to all the first mark positions, the electron beam may be scanned by the second incident energy with respect to all the first mark positions.

Figure 4A:
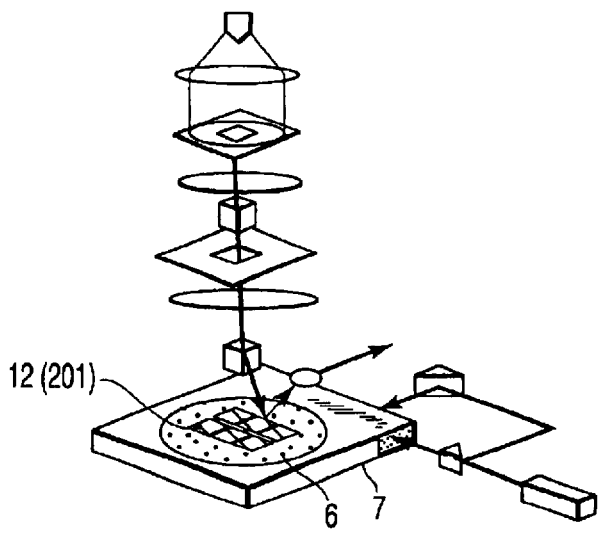
FIGS. 4A to 4C are diagrams showing a movement of a main part of the exposure apparatus in the course of alignment in the first embodiment.
Figure 4C:
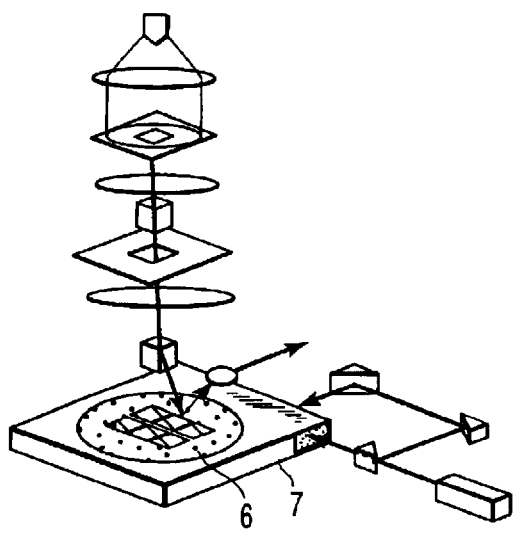
Figure 4B:
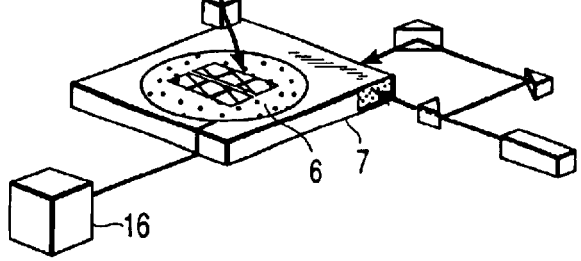

An alignment method in the first embodiment will next be described with reference to FIGS. 3B, 4A to 4C, 5A to 5E, and 6. FIGS. 4A to 4C are diagrams showing the movement of the exposure apparatus with the alignment, and FIGS. 5A to 5E are explanatory views of the alignment method. A plurality of chips 8 are formed on the wafer 6 to be exposed, and the alignment mark 12 is disposed on each chip 8. Here, steps subsequent to a step of loading the wafer 6 onto the stage 7 will be described.

1) First, position information of all the marks 12 (first mark 201) to be detected on the wafer 6 is read out from the wafer layout information 118 of FIG. 3B (S1 of FIG. 6).

Figure 5A:
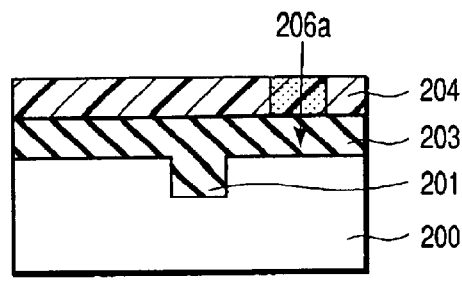
FIG. 5A is a sectional view of a wafer and shows a method of forming a vernier pattern.
Figure 5B:
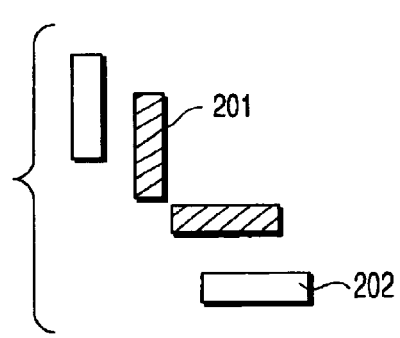
FIG. 5B is an explanatory view of a position relation between the vernier pattern and an alignment mark.

2) Subsequently, as shown in FIG. 4A, the wafer 6 is moved to the position in which the electron beam exposure is possible, and the alignment exposure is performed based on the chip position calculated in 1). In this case, as shown in FIG. 5B, a vernier pattern (second mark) 202 is exposed to the first incident energy beside the alignment mark (first mark) 201 (corresponding to the mark 12) (S2 and S3 of FIG. 6).

Here, the mark is exposed by the first incident energy, while no voltage is applied from the sample power supply (i.e., while a voltage of 0 V is applied). In this case, the incident energy to the resist is the acceleration voltage applied to the electron gun, and indicates 5 keV. Moreover, a section of the alignment mark 201 is shown in FIG. 5A. The alignment pattern 201 is formed of a groove having a width of 0.5 µm and depth of 0.5 µm on an Si substrate 200, and the pattern is coated with an insulator film 203 having a thickness of 0.5 µm. The insulator film 203 is flatted, and coated with a resist 204 having a thickness of 0.2 µm. Subsequently, the resist is irradiated with an electron beam 206a and the latent image 202 is formed.

In FIG. 5A, the alignment pattern 201 is a recess formed on the substrate 200, but it may be a protrusion formed on the substrate 200 and buried in the flatted insulator film 203.

Figure 5C:
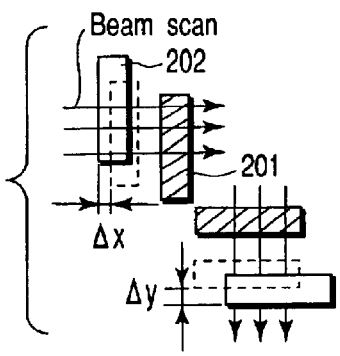
FIG. 5C is an explanatory view of a positional shift of the vernier pattern.
Figure 5D:
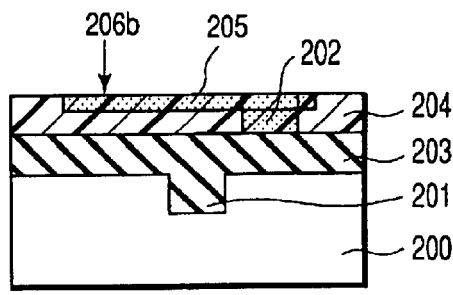
FIG. 5D is a sectional view of the wafer and shows an electron beam scanned to measure the positional shift.

3) Subsequently, as shown in FIG. 4B, the sample power supply 16 is used to apply a voltage of 4 kV to the wafer 6. Thereby, the energy of the electron beam 14 incident upon the wafer 6 decreases to 1 keV, and the range of the electron becomes smaller than the resist film thickness. In this case, as shown in FIG. 5C, the periphery of the vernier pattern exposed in 3) is scanned. The section during the beam scanning is shown in FIG. 5D. Since the incident energy of an electron beam 206b is small, a scanned region 205 is not exposed down to a bottom thereof (S6 to S8 of FIG. 6).

Figure 5E:
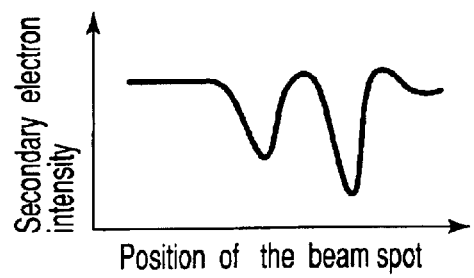
FIG. 5E is a diagram showing a secondary electron beam intensity profile obtained as a result of the electron beam scanning of FIG. 5D.

When the secondary electron signal obtained by the beam scanning is detected, the voltage contrast image can be detected as shown in FIG. 5E. It is possible to detect a relative positional shift amount of the alignment mark 201 and vernier pattern 202 from the voltage contrast image. This step is performed on a plurality of positions, and a correction value (Δx, Δy) is obtained in each position (S9 of FIG. 6).

FIG. 7 shows the voltage contrast image of an alignment mark pattern and vernier pattern. In FIG. 7, ΔX indicates the correction value.

4) The correction value obtained in 3) is considered in the chip position calculated in 1), and a more accurate chip position is calculated (S11 of FIG. 6).

5) Subsequently, as shown in FIG. 4C, the sample power supply 16 stops the voltage application, and the alignment exposure of a mask pattern is performed by a desired acceleration energy based on the chip position obtained in 4) (S12 of FIG. 6).

An action and effect of the exposure performed as described above will be described hereinafter.

Figure 8:
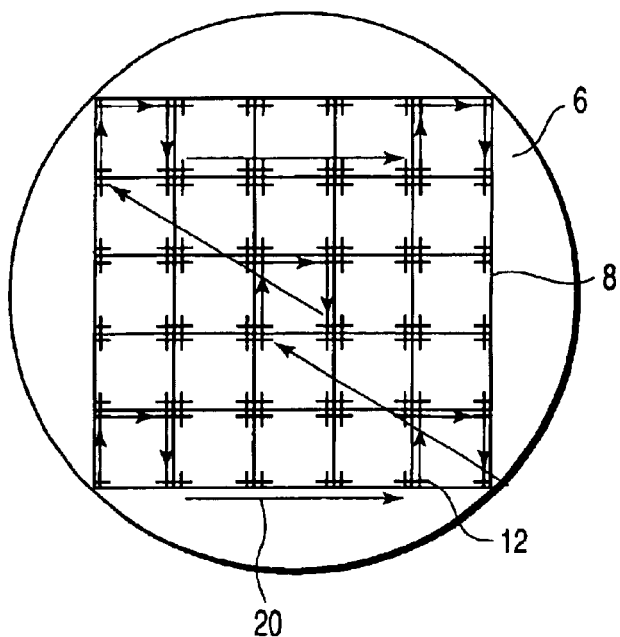
FIG. 8 is a diagram showing the stage movement for detecting the mark in the first embodiment.

First, since the global alignment is performed, the frequency of the stage movement 20 can be reduced as shown by arrows of FIG. 8. As a result, a time required for detecting the mark can be reduced as compared with the conventional method, and a productivity in the electron beam exposure can be enhanced.

Secondly, the vernier pattern 202 is exposed based on the position information of the first mark from the wafer layout information file, the positional shift between the vernier pattern 202 and the alignment pattern 201 is measured, and an alignment error is corrected. Thereby, a precision in the global alignment can be enhanced.

In the global alignment, all the chips on the wafer are not positioned during the exposure. Therefore, in the conventional method, after a preliminary wafer is aligned/exposed and the pattern is formed before the exposure step, the positional shift of the pattern is inspected, and the position needs to be corrected during the exposure step. Additionally, the preliminary wafer is a testing substrate subjected to a process flow similar to that of a desired exposure substrate. Such preliminary treatment substantially deteriorates an exposure throughput, and also deteriorates the precision of the alignment exposure.

On the other hand, in the first embodiment, after the global alignment, the vernier pattern (second mark) is exposed, and further the alignment error from the alignment mark (first mark) can be measured without removing the chip from the apparatus. As a result, the treatment of the preliminary wafer as a disadvantage of the conventional global alignment is unnecessary, and the exposure throughput is enhanced. Furthermore, the correction value can be obtained in the apparatus. Therefore, even when the correction value is obtained for each wafer to be exposed, the exposure throughput is not deteriorated, different from the conventional method. As a result, the alignment exposure can be realized with the high precision.

Thirdly, the second incident energy in the pattern observation is smaller than the first incident energy during the pattern exposure. As a result, even when the resist surface is scanned with the beam and the pattern is observed, the latent image (vernier pattern) in the resist exposed with the first incident energy is prevented from being superposed and exposed. Therefore, the latent image can be detected with the high precision. As a result, it is possible to highly precisely measure the positional shift amount between the alignment mark and the vernier pattern.

Particularly, when the second incident energy is set to 3 keV or less, only about 0.3 μm from the surface of the insulator film having a thickness of several micrometers on the mark is exposed, and the surface can effectively be charged. Moreover, when the second incident energy is set to 1 keV or less, only about 0.05 μm from the resist surface is exposed. This can be regarded as only little exposure, and is more effective.

Figure 9A:
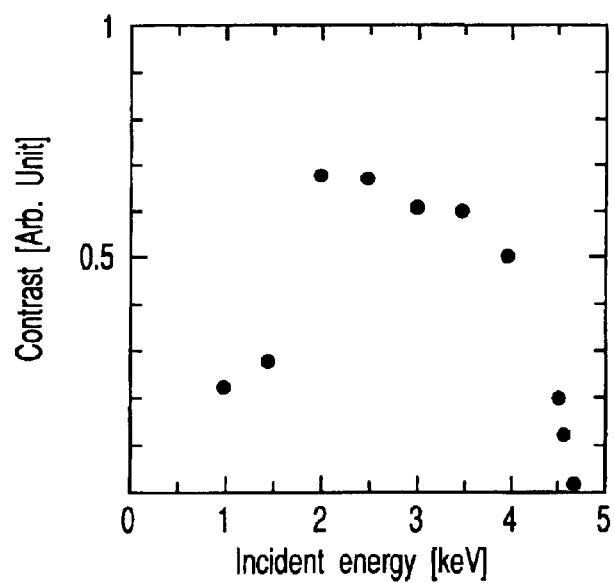
FIG. 9A is a diagram showing a relation between a second incident energy and a contrast during pattern observation with respect to a sample shown in FIG. 5A.

Here, FIG. 9A shows a relation between the second incident energy and contrast during the pattern observation with respect to the sample shown in FIG. 5A. Here, a contrast C is defined as $C=|A-B|/|A+B|$. A character A denotes a signal value from the mark, and B denotes a signal value from portions other than the mark.

As shown in FIG. 9A, when the acceleration voltage is about 3 keV, a maximum contrast is obtained. There are various substrate types. However, with the incident energy substantially of about 3 keV, the voltage contrast image (FIG. 9B) having a satisfactory contrast is obtained. This is because the resist surface can efficiently be charged with this energy as described above.

Fourthly, a bias voltage is applied to the wafer 6 in order to change the incident energy during the pattern observation and during the pattern exposure. In this case, the electron gun and electron beam optics for the exposure, and the optics for detecting the positions of the latent image and alignment mark can be used in common. As a result, the apparatus configuration can be simplified.

Additionally, in the first embodiment, the energy application from the sample power supply 16 is stopped, and the first incident energy is set to 5 keV when the exposure is performed. However, the energy application from the sample power supply 16 does not have to be stopped. The incident energy during the exposure is not limited as long as the electron is passed through the resist.

Figure 10:
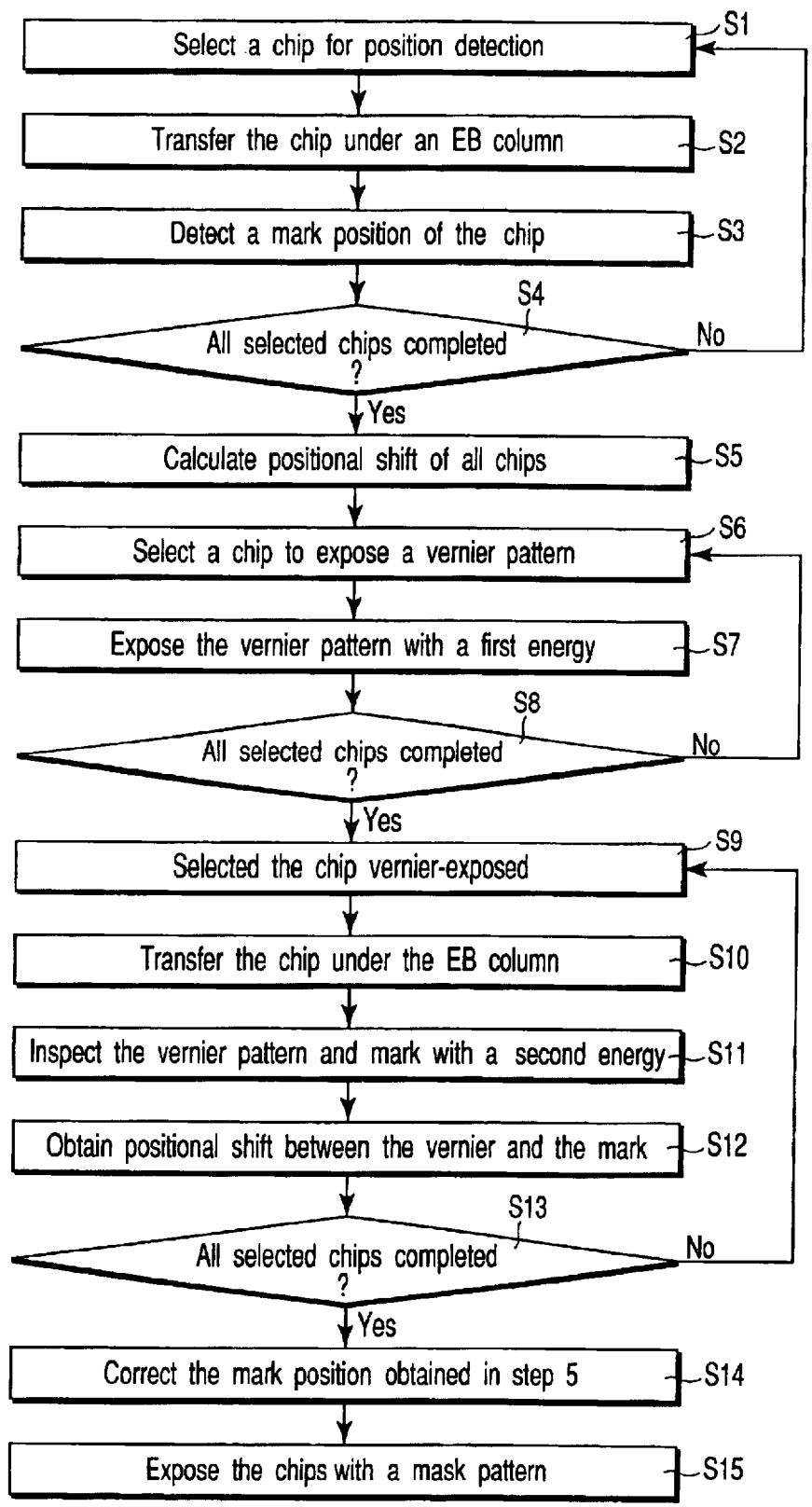
FIG. 10 is a flowchart of an alignment method in a modification example of the first embodiment.

Moreover, in the aforementioned embodiment, the stage is moved based on the position information of the mark 12 (first mark 201) read out from the wafer layout information file 118. When a mechanical precision during mounting of the wafer 6 onto the stage 7 is insufficient, the second mark (vernier pattern) cannot be exposed in the vicinity of the mark 12. In this case, the exposure may be performed as follows (see a flowchart of FIG. 10).

1) The exposure control circuit 116 reads the positions of the plurality of alignment marks (first marks 201) to be detected on the wafer 6 from the wafer layout information 118. Subsequently, the exposure control circuit 116 issues the command to the stage control circuit 115 and moves the stage 7. Thereby, the first mark 201 on the wafer 6 is positioned in the range which can be exposed to the electron beam (S1, S2 of FIG. 10).

2) Subsequently, the exposure control circuit 116 uses the incident energy control circuit 119 to change the first incident energy to the second incident energy, and scans the region including the first mark 201 by the electron beam 14 with the second incident energy. The secondary electron generated by the scanning is detected by the detector 11. The secondary electron signal detected by the detector 11 is amplified by the detection amplifier 112, and the positional shift amount calculation circuit 113 calculates the positional shift amount of the first mark 201 from the image signal or the waveform signal. The positional shift amount is a shift amount between an actual first mark position and a value estimated based on the wafer layout information 118. The calculated positional shift amount of the first mark is stored by the exposure control circuit 116 (S5 of FIG. 10).

3) Subsequently, the exposure control circuit 116 exposes the second mark having the predetermined shape with the first incident energy in the predetermined position in the vicinity of the first mark. In this case, it is meant by the predetermined position in the vicinity of the first mark that the position relation between the first and second marks is predetermined and the marks are exposed with the predetermined relation. In this case, the exposure control circuit 116 stores the deflected position of the electron beam 14 and the stage position (S7 of FIG. 10).

4) Subsequently, the incident energy control circuit 119 is used to change the first incident energy to the second incident energy, and scans the region including the first and second marks by the electron beam 14 with the second incident energy. The secondary electron generated by the scanning is detected by the detector 11.

The secondary electron signal detected by the detector 11 is amplified by the detection amplifier 112, and transmitted as the image signal or the waveform signal to the positional shift amount calculation circuit 113. The positional shift amount calculation circuit 113 calculates the positional shift amount between the first and second marks from the transmitted image or waveform signal. The calculated positional shift amount between the first and second marks is stored by the exposure control circuit 116 (S9 and S10 of FIG. 10).

5) The steps 2 to 4 are performed for the number of all the first marks 201 on the wafer 6 to be detected. Similarly as the first embodiment, the correction value is considered, the chip position is calculated, and the alignment exposure is performed (S14, S15 of FIG. 10).

Even in this method, the effect similar to that of the aforementioned embodiment can be obtained.

Second Embodiment

Figure 11:
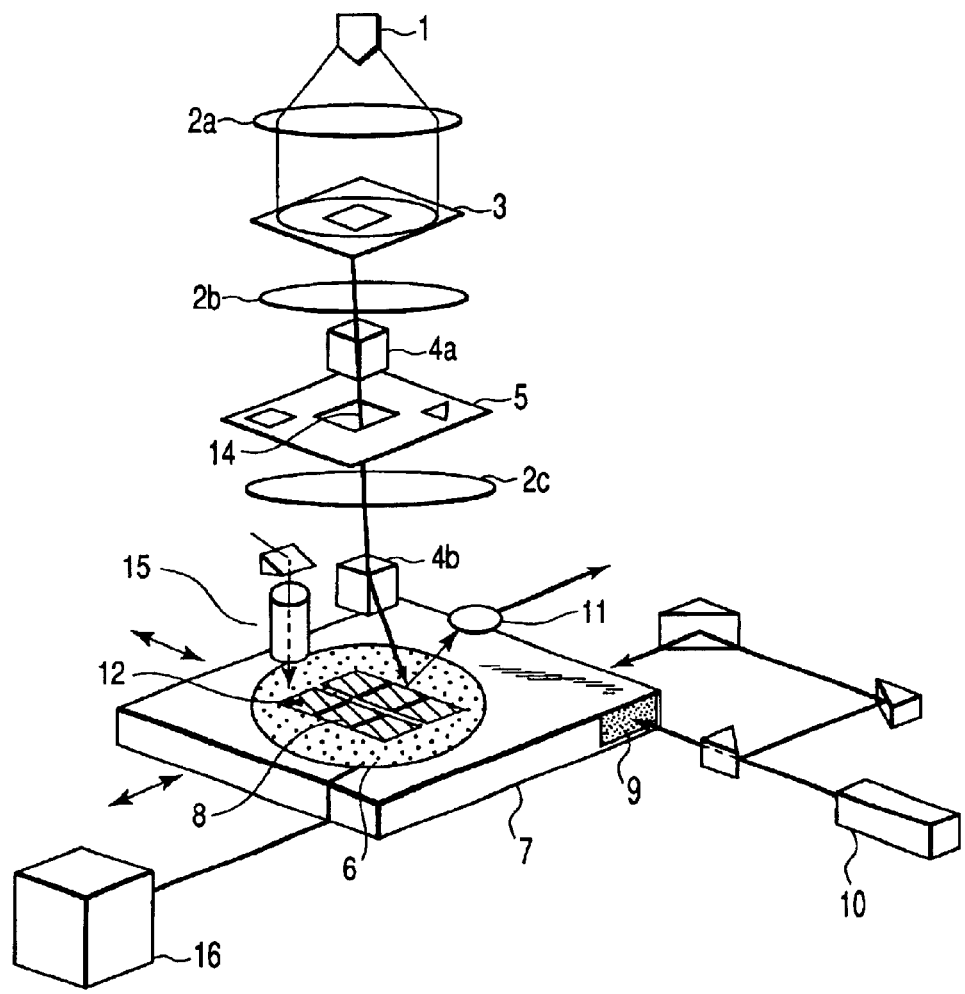
FIG. 11 is a schematic configuration diagram showing an electron beam exposure apparatus according to a second embodiment.

FIG. 11 is a schematic configuration diagram showing the electron beam exposure apparatus according to a second embodiment of the present invention. The control system of the exposure apparatus is similar to that shown in FIG. 3B of the first embodiment.

In addition to the configuration of the first embodiment, the second embodiment has the following characteristic configuration. That is, the characteristic of the present apparatus lies in that an off-axis optical microscope 15 is disposed. The off-axis optical microscope 15 irradiates the mark 12 on the wafer 6 with the laser beam, detects an optical image by a scattered light or a reflected light, and thereby detects the mark position.

Figure 13:
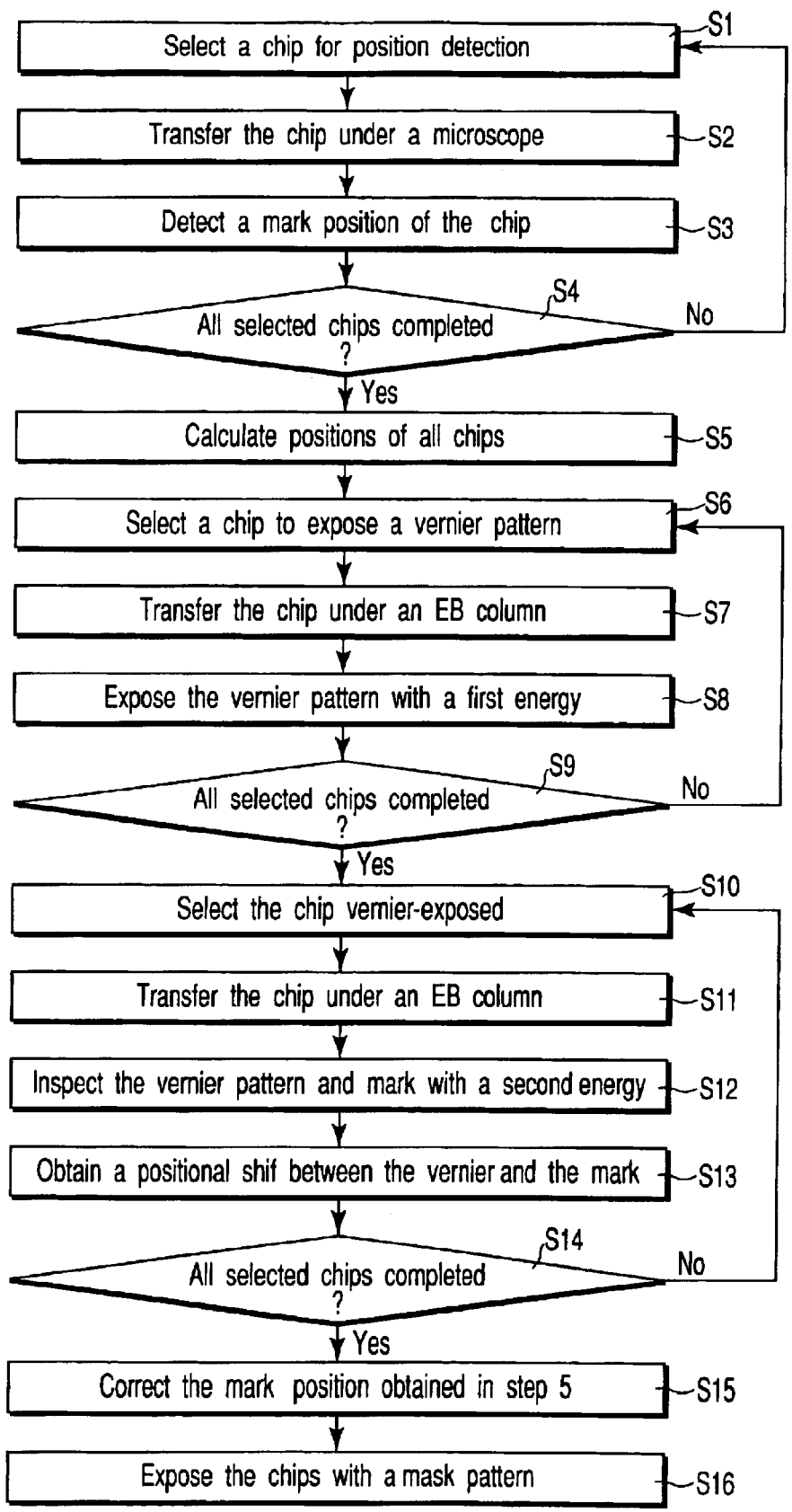
FIG. 13 is a flowchart of the alignment method in the second embodiment.

The alignment method in the second embodiment will next be described with reference to FIGS. 12A to 12D, and 13. FIGS. 12A to 12D are diagrams showing the movement of the exposure apparatus with the alignment, and FIG. 13 is a flowchart of the alignment method. The plurality of chips 8 are formed on the wafer 6 to be exposed, and the alignment mark 12 is formed in each chip 8. Here, steps subsequent to the step of mounting the wafer 6 onto the stage 7 will be described.

1) First, as shown in FIG. 12A, the off-axis optical microscope 15 is used to detect the position of the chip 8. In this case, the detection of the positions (global alignment) of representative five chips (a central chip and four peripheral chips) on the wafer 6 is performed. The mark 12 (first mark 201) is moved to right under the microscope 15 and the position thereof is detected (S1 to S3 of FIG. 13).

2) The positions of all the chips on the wafer 6 are calculated based on a predetermined calculation equation from the chip positions obtained in 1) (S5 of FIG. 13).

3) Subsequently, as shown in FIG. 12B, the wafer 6 is moved to the position which can be exposed with the electron beam, and aligned/exposed with the beam based on the chip position calculated in 1). In this case, similarly as shown in FIG. 5B, the vernier pattern (second mark) 202 is exposed with the first incident energy beside the alignment mark (first mark) 201 (S6 to S8 of FIG. 13).

The condition of the first incident energy is the same as that of the first embodiment, and the subsequent steps are carried out similarly as S6 and the subsequent steps of the first embodiment (FIG. 6).

The action and effect of the exposure performed as described above will be described hereinafter.

First, since the off-axis optical microscope 15 detects the alignment mark, the resist on the mark is prevented from being excessively exposed.

Secondly, with the global alignment, as shown by the arrows of FIG. 8, the frequency of the stage movement 20 can be reduced. As a result, the time required for detecting the mark can be reduced as compared with the conventional method. As a result, the productivity in the electron beam exposure can be enhanced.

Thirdly, the vernier pattern 202 is exposed based on the alignment result by the optical microscope, the positional shift between the vernier pattern 202 and the alignment pattern 201 is measured, and the alignment error is corrected. Thereby, the positioning precision in the global alignment can be enhanced.

As described above, even in the second embodiment, the effect similar to that of the first embodiment can be obtained.

Third Embodiment

FIG. 14 is a schematic configuration diagram showing the electron beam exposure apparatus according to a third embodiment of the present invention. Additionally, the same components as those of FIG. 11 are denoted with the same reference numerals, and detailed description thereof is omitted. This also applies to subsequent embodiments.

The third embodiment is different from the second embodiment in that the power supply 16 for applying the voltage to the sample is not disposed, and instead an electron beam scanner 60 for observing the pattern is disposed. The electron beam scanner 60 for observing the pattern has an electron gun 61, projection and objective lenses 62a, 62b, and deflector 64, and can scan a desired region on the wafer 6 with an electron beam having an acceleration energy of 1 keV.

With the apparatus, in the afore-mentioned step 4), the electron beam scanner 60 is used instead of the sample power supply 16, and the periphery of the vernier pattern is scanned while the energy of the electron beam incident upon the wafer 6 is decreased to 1 keV. Thereby, the positional shift of each mark can be measured. Therefore, the effect similar to that of the first or second embodiment can be obtained.

Additionally, the third embodiment has the apparatus configuration in which the sample power supply 16 is not used. However, even when the sample power supply 16 is added to the third embodiment, there is no disadvantage. For example, the electron beam scanner 60 for observing the pattern as well as the sample power supply 16 may be used to apply the voltage to the sample. In this case, the acceleration voltage of the electron beam scanner 60 for observing the pattern may be determined in consideration of the voltage applied from the sample power supply 16. Even in this case, the effect similar to that of the first embodiment can be obtained.

Fourth Embodiment

In a fourth embodiment, a method of using a standard mark formed on the stage or a wafer pallet to correct a baseline shift of an alignment optics and exposure optics will be described. A charged particle beam exposure apparatus for use in the fourth embodiment has a configuration similar to that of the second embodiment.

Figure 15A:
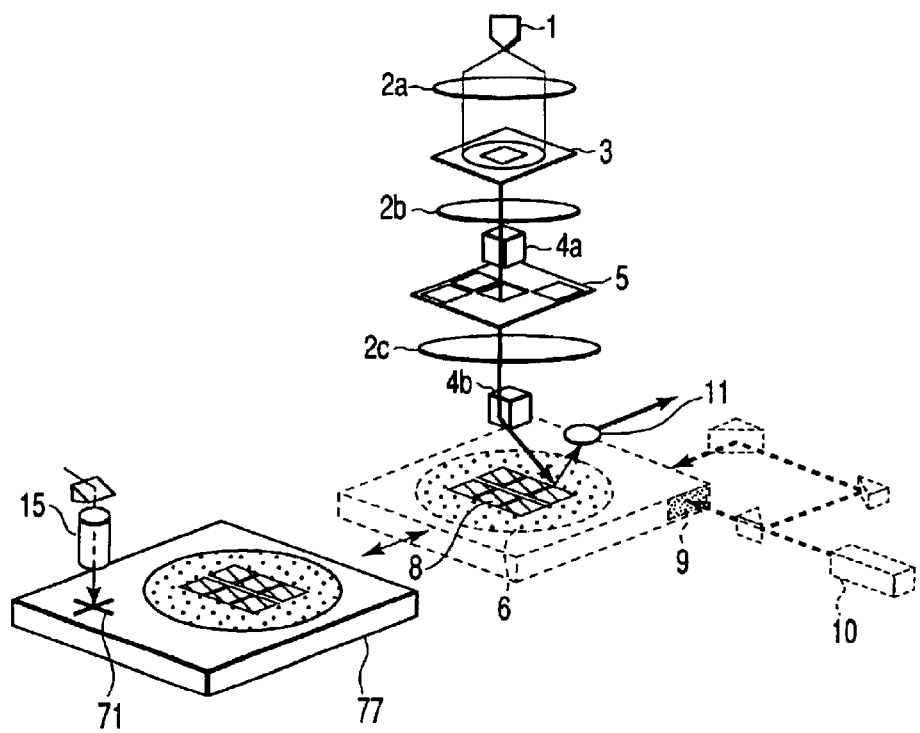
FIGS. 15A and 15B are diagrams showing a schematic configuration and exposure method of the electron beam exposure apparatus according to a fourth embodiment.
Figure 15B:
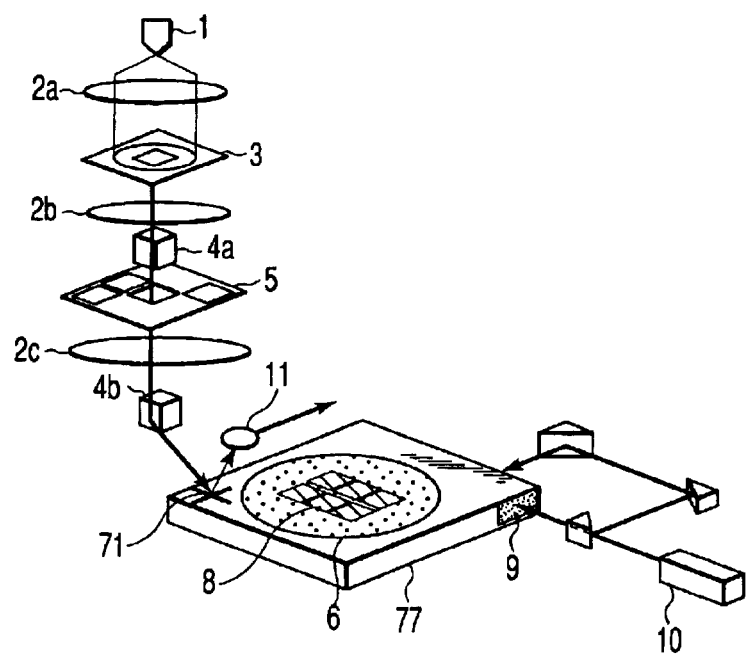

In the alignment method of the fourth embodiment, first as shown in FIG. 15A, the off-axis optical microscope 15 is used to measure the position of a standard mark 71 formed on a wafer pallet 77. Subsequently, as shown in FIG. 15B, the position of the standard mark 71 on the pallet 77 is measured by scanning the electron beam. In this manner, the baseline shift (positional shift) between the alignment optics (off-axis microscope) and the electron beam optics is measured. Furthermore, the chip position is corrected based on the measured baseline shift, and the pattern exposure and vernier exposure are performed. This respect is similar to that of the second embodiment.

This method is effective for treating a plurality of wafers. For example, when 20 wafers of the same type are treated, the first wafer is subjected to a treatment similar to that of the second embodiment, and only the baseline shift is calculated with respect to second and subsequent wafers. When the baseline shift is larger than a predetermined reference value, the treatment described in the first or second embodiment may be performed again.

Additionally, in the fourth embodiment, the standard mark 71 is formed on the wafer pallet 77. However, as shown in FIGS. 16A and 16B, a standard mark 72 for correcting the baseline may be disposed on the wafer 6. Even in this case, the effect similar to that of the fourth embodiment can be obtained.

The action and effect of the exposure performed as described above will be described hereinafter.

First, the baseline shift between the alignment optics (off-axis microscope) and the electron beam optics can be measured, so that the measurement precision of the mark position in the alignment optics is enhanced. As a result, the positioning precision in the pattern exposure and vernier exposure is enhanced.

Secondly, a treatment time for treating a plurality of wafers can be reduced. That is, only the first wafer is subjected to the vernier exposure, and only the baseline shift is measured with respect to the second and subsequent wafers. In this case, the time for the alignment can be reduced, and the productivity in the drawing with the electron beam can be enhanced.

Fifth Embodiment

Figure 17:
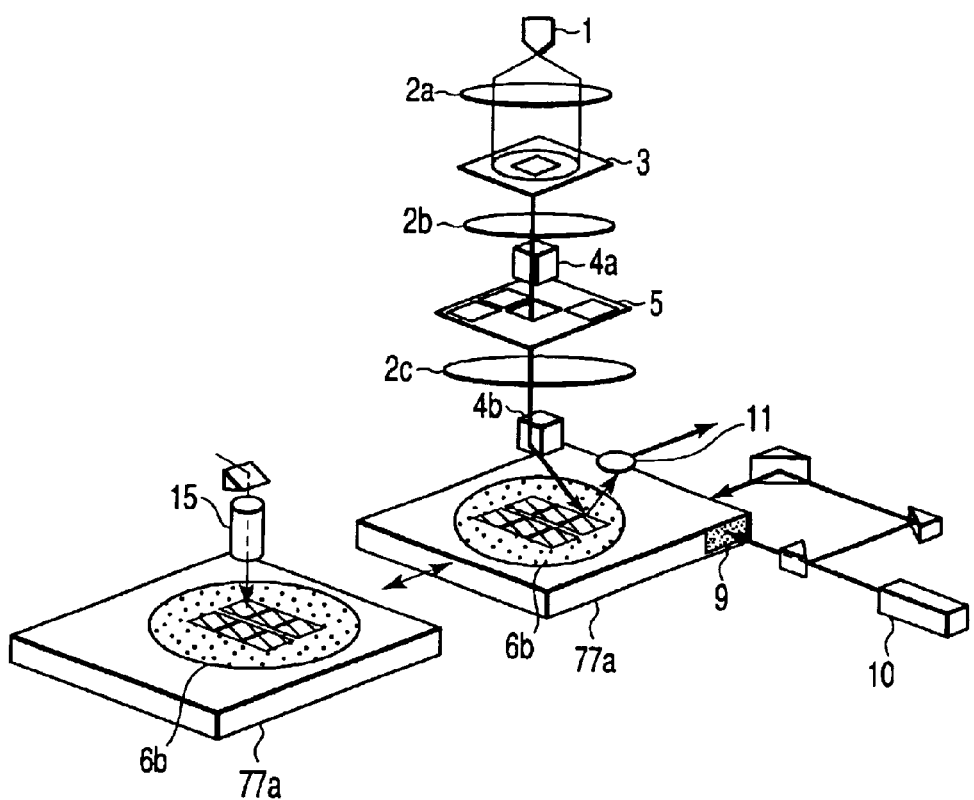
FIG. 17 is a schematic configuration diagram showing the electron beam exposure apparatus according to a fifth embodiment.

In a fifth embodiment, a method of simultaneously performing alignment and positional shift inspection will be described with reference to FIG. 17. The basic configuration of the electron beam exposure apparatus for use herein is similar to that of the exposure apparatus used in the second embodiment. However, as shown in FIG. 17, the fifth embodiment is different from the second embodiment in that two wafer pallets 77a, 77b for loading the wafer 6 are disposed and an alignment operation and exposure operation are performed at the same time. An exposure method of the fifth embodiment will be described hereinafter in detail with reference to FIG. 17.

1) A wafer 6a is mounted on the pallet 77a in an alignment chamber.

2) The off-axis optical microscope 15 is used to detect the mark position with respect to the wafer 6a disposed on the pallet 77a. The mark positions of eight chips are detected.

3) Subsequently, the pallet 77a is moved under the electron beam optics, and the vernier pattern is exposed. Here, the same number of chips as the chips subjected to the mark position detection, that is, eight chips are subjected to the exposure of the vernier pattern.

4) A wafer 6b is mounted on the pallet 77b at the same time as the step 3).

5) The positional shift inspection of the wafer 6a disposed on the pallet 77a, and the mark position detection of the wafer 6b disposed on the pallet 77b are carried out at the same time. Here, the number of the chips of the wafer 6b subjected to the mark position detection is the same as that of chips of the wafer 6a subjected to the positional shift detection, and is eight. Therefore, the stage movement frequency is the same, and each treatment can be performed substantially in the same time. FIG. 17 shows this state.

6) After the positional shift inspection of the wafer 6a on the pallet 77a is ended, the chip position is corrected and the alignment exposure is performed similarly as the second embodiment. In this case, the wafer 6b disposed on the pallet 77b is on standby.

7) After the exposure of the wafer pattern on the pallet 77a is ended, the wafer 6b disposed on the pallet 77b is moved to under the electron beam optics, and the vernier pattern is exposed. Here, the same number of chips subjected to the mark position detection, that is, eight chips are subjected to the exposure of the vernier pattern.

8) The wafer 6a disposed on the pallet 77a is retreated simultaneously with the step 7), and another wafer 6 is disposed on the pallet 77a.

9) The positional shift inspection of the wafer 6a on the pallet 77a, and the mark position detection of the wafer 6b on the pallet 77b are carried out at the same time. The operation of the steps 6) to 8) is repeated thereafter.

The characteristic of the fifth embodiment lies in a driving method of the stage in the steps 5) and 9). This method will be described with reference to FIGS. 18A to 18C. The alignment optics, electron beam optics, wafer 6a disposed on the pallet 77a, and wafer 6b disposed on the pallet 77b are shown.

Figure 18A:
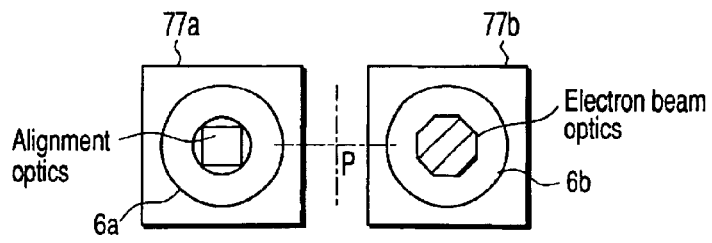
FIGS. 18A to 18C are explanatory views of a stage driving method in the fifth embodiment.
Figure 18B:
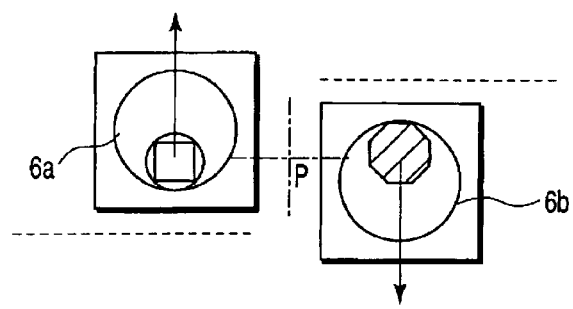
Figure 18C:
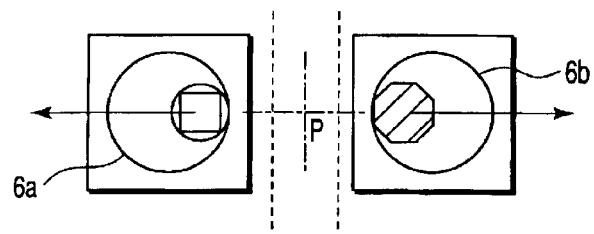

FIG. 18A shows a basic arrangement. FIG. 18B shows an example in which the pallets 77a and 77b are driven in a vertical direction, and FIG. 18C shows an example in which the pallet is driven in a horizontal direction.

For the movement for the alignment and electron beam (vernier) exposure, as shown in the drawings, the pallets 77a and 77b are moved in a symmetric direction with respect to a center point P between the alignment optics and the electron beam optics. Even when the stage is moved at a high speed, a load balance is kept, and it is possible to inhibit the apparatus from vibrating.

As described above, according to the fifth embodiment, the alignment and the positional shift inspection can be performed at the same time. As a result, the exposure throughput can be enhanced as compared with the treatment of the wafers one by one. Moreover, when the loads of two stages are balanced, and the stages are driven, the apparatus can be inhibited from being vibrated by the stage driving. Therefore, the mark position can be detected and the beam can be positioned with the high precision, and a high-precision alignment can also be realized.

Sixth Embodiment

Figure 19:
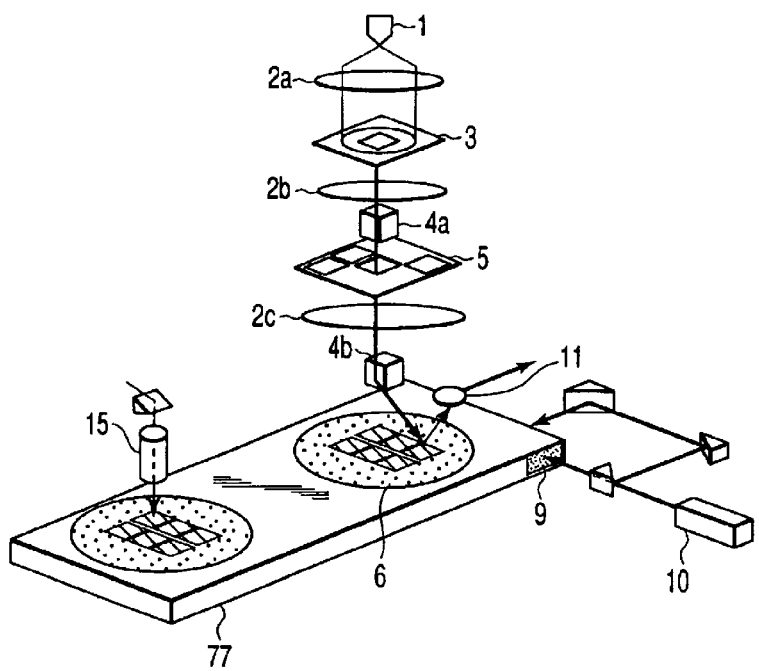
FIG. 19 is a schematic configuration diagram showing the electron beam exposure apparatus according to a sixth embodiment.

A sixth embodiment will be described as a modification embodiment of the fifth embodiment with reference to FIG. 19. In the embodiment, two wafers can be loaded on the wafer pallet.

The basic configuration of the electron beam exposure apparatus for use in the sixth embodiment is similar to that of the exposure apparatus used in the second embodiment. However, the sixth embodiment is different from the second embodiment in that a wafer pallet loaded with two wafers is disposed and the alignment operation and exposure operation are carried out at the same time.

Figure 20:
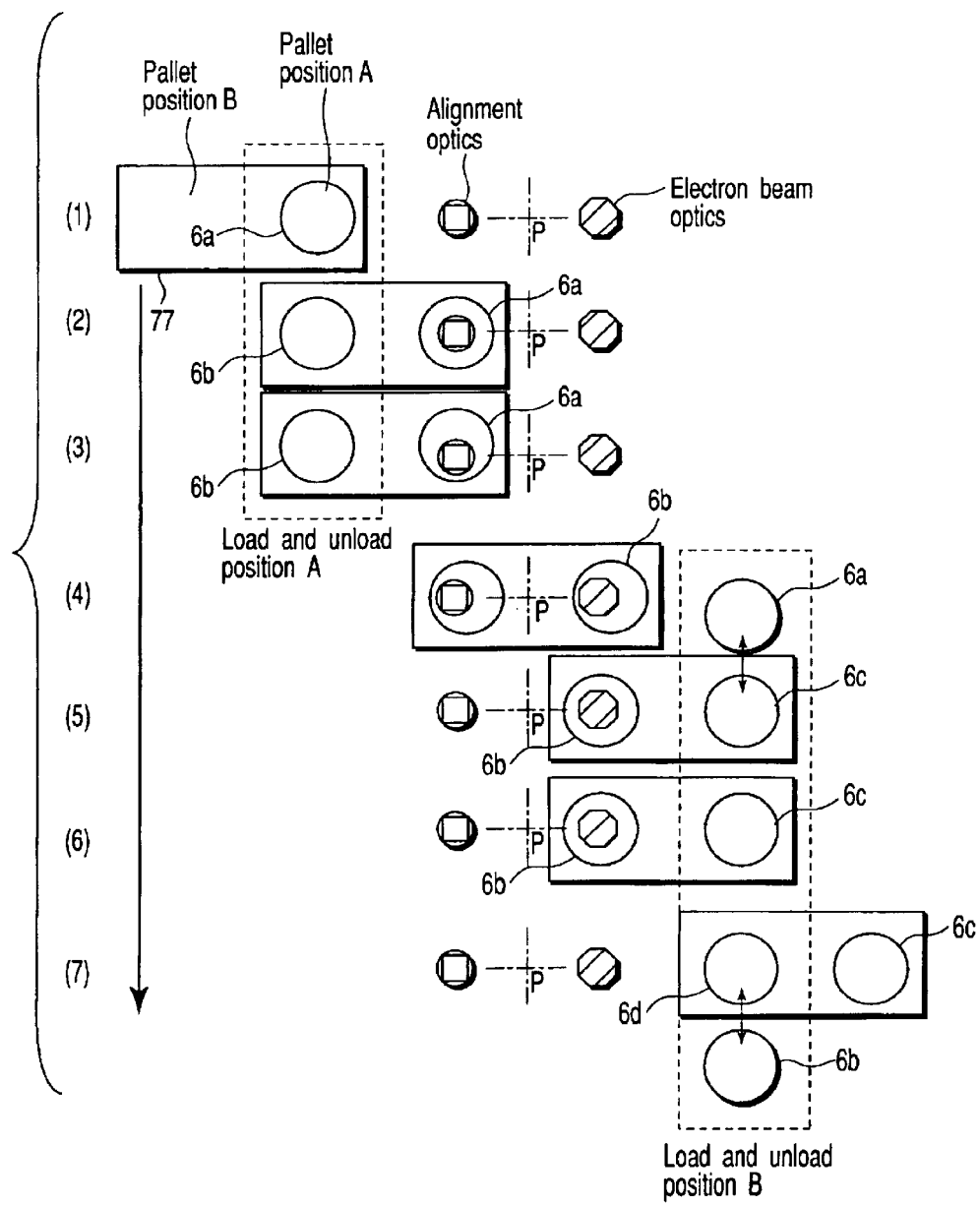
FIG. 20 is an explanatory view of the stage driving method in the sixth embodiment.

The exposure method of the sixth embodiment will be described hereinafter in detail with reference to FIG. 20. FIG. 20 shows the alignment optics, electron beam optics, wafer pallet 77, positions A and B on the pallet 77, and load/unload positions A and B.

1) The wafer 6a is loaded in the position A on the pallet 77 in the wafer load/unload position A.

2) The wafer 6a loaded on the pallet 77 is moved to under the alignment optics. In this case, the wafer 6b is loaded onto the pallet 77.

3) The off-axis optical microscope is used to detect the mark position with respect to the wafer 6a. The mark positions were detected with respect to eight chips.

4) The wafer 6a is moved to under the electron beam optics. The vernier pattern is exposed. Here, the same eight chips as the chips subjected to the mark position detection were subjected to the exposure of the vernier pattern. Furthermore, the positional shift inspection of the wafer 6a under the electron beam optics, and the mark position detection of the wafer 6b under the alignment optics are performed at the same time. Here, the number of chips subjected to the mark position detection of the wafer 6b is the same as that of chips subjected to the positional shift inspection of the wafer 6a, and is eight. Therefore, the stage movement range becomes the same, and each treatment can be performed substantially simultaneously. After the positional shift inspection of the wafer 6a is ended, the pattern exposure of the wafer position is performed.

5) After the pattern exposure of the wafer 6a is ended, the wafer 6a is moved to the load/unload position B, and the wafer 6a is removed. Simultaneously, the wafer 6c is loaded in the position A on the pallet 77. In this case, the wafer 6b moves to under the electron beam optics.

6) The pattern of the wafer 6b is exposed.

7) After the pattern exposure of the wafer 6b is ended, the wafer 6b is moved to the load/unload position B, the wafer 6b is removed, and a wafer 6d is loaded.

Thereafter, the operation of the steps 2) to 7) is repeated.

Figure 21:
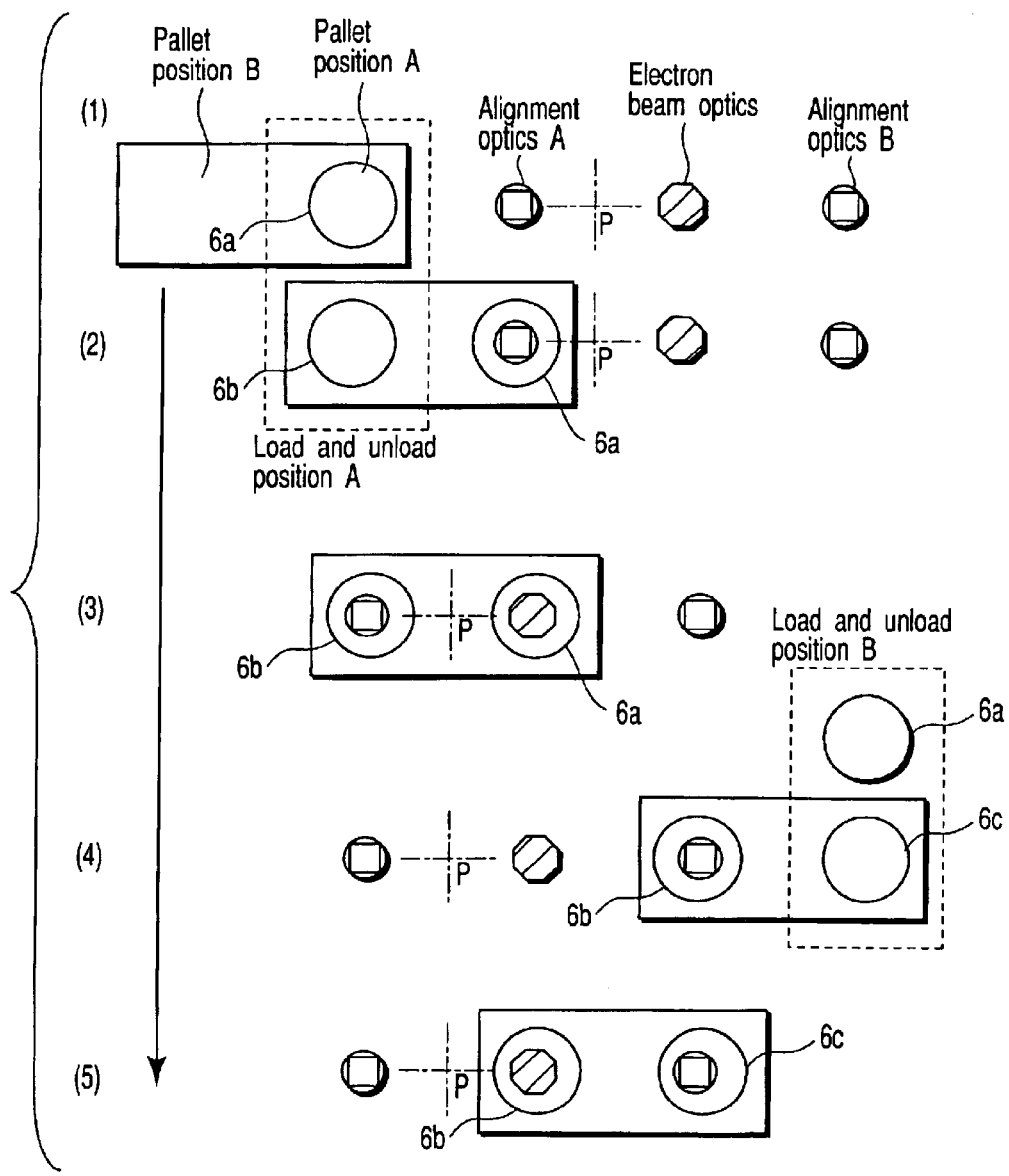
FIG. 21 is an explanatory view of the stage driving method in the modification example of the sixth embodiment.

Additionally, as shown in FIG. 21, two alignment optics may be disposed. In this case, the operation is performed as follows.

1) The wafer 6a is loaded.

2) The wafer 6a is aligned.

3) The vernier exposure of the wafer 6a is performed, the positional shift inspection of the wafer 6a is performed simultaneously with the alignment of the wafer 6b, and subsequently the pattern of the wafer 6a is exposed.

4) The wafer 6a is removed and the wafer 6c is loaded.

5) The vernier exposure of the wafer 6b is performed, the positional shift inspection of the wafer 6b and the alignment of the wafer 6c are simultaneously performed, and subsequently the pattern exposure of the wafer 6b is performed.

According to the sixth embodiment, similarly as the fifth embodiment, the alignment can be carried out simultaneously with the positional shift inspection. As a result, the exposure throughput can be enhanced with the treatment of the wafers one by one.

Additionally, the present invention is not limited to the respective embodiments. The configuration of the exposure apparatus is not limited to the configuration of FIG. 3A or FIG. 11, and can appropriately be changed in accordance with specifications. Moreover, the present invention is not limited to the electron beam, and can also be applied to the exposure in which an ion beam is used.

The latent image in the resist described in the embodiments indicates that the chemical, electrical, or physical change is generated in the resist by the charged particle beam exposure. Concretely, a change of film thickness or a change of conductivity is generated by decomposition of a photosensitive material. The present invention can also be applied even when the change of the resist (i.e., the latent image) by the charged particle beam exposure is not remarkably generated. Here, a case in which the latent image by the charging beam is not easily generated corresponds to 1) the exposure of the vernier pattern with a small exposure amount to such an extent that the resist is not exposed, 2) a case in which an Si oxide film, and the like require a large exposure amount, and 3) the use of a resist which does not easily cause a film thickness change or a conductivity change by the charged particle beam exposure. Even in this case, when the vernier pattern is exposed, and a charged trace is formed on the resist surface, the positional shift amount between the vernier pattern and the alignment mark can be detected. FIG. 22 shows the alignment mark image and the voltage contrast image by a charged trace of the vernier pattern.

Moreover, to measure the alignment error of the vernier pattern and alignment mark in the embodiment, the electron beam may be scanned at random in a beam scanning region, or may be scanned in a reciprocating direction. In this manner, a distortion of the signal waveform depending on the beam scanning direction can be reduced.

As described above in detail, according to the present invention, when the alignment mark is detected with the optical microscope, the resist on the mark is not excessively exposed. Moreover, the vernier pattern is exposed based on the position information of the alignment mark, the positional shift between the vernier pattern and the alignment pattern is measured, and the alignment error is corrected, so that the alignment exposure can be realized with the high precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam exposure apparatus, comprising:

a beam gun which emits a charged particle beam;

a projection optics which shapes said charged particle beam and projects a desired pattern;

an incident energy control circuit which controls an incident energy of said projection optics;

a sample stage loaded with a sample in which an image projected from said projection optics is to be formed, a plurality of first marks are formed beforehand, and a plurality of second marks are exposed to said charged particle beam with a first incident energy by said projection optics in the vicinity of said plurality of first marks;

a detector to detect an electron signal generated from a region including said plurality of first marks and said plurality of second marks, when said region is scanned with a second incident energy different from said first incident energy;

a calculation circuit which calculates a positional shift amount between said plurality of first marks and said plurality of second marks from said detected electron signal;

a correction circuit which corrects positions of said plurality of first marks on said sample based on said calculated positional shift amount; and an exposure control circuit which aligns said desired pattern based on corrected positions of said plurality of first marks.

2. The charged particle beam exposure apparatus according to claim 1, further comprising an optical microscope which measures said positions of said plurality of first marks.

3. The charged particle beam exposure apparatus according to claim 2, wherein said optical microscope to measure said positions of said plurality of first marks measures some of the positions of said plurality of first marks, and calculates the other positions of said plurality of first marks based on measurement results of said some positions.

4. The charged particle beam exposure apparatus according to claim 1, wherein said second incident energy is smaller than said first incident energy.

5. The charged particle beam exposure apparatus according to claim 4, wherein said second incident energy is 3 keV or less.

6. The charged particle beam exposure apparatus according to claim 1, further comprising a power supply which applies a voltage to said sample in order to allow said first incident energy and said second incident energy to differ from each other.

7. The charged particle beam exposure apparatus according to claim 1, further comprising a charged particle beam optics to which said second incident energy is inputted separately from said projection optics in order to allow said first incident energy and said second incident energy to differ from each other.

8. The charged particle beam exposure apparatus according to claim 1, wherein said first mark is formed on the surface of said sample, and said second mark is a latent image formed on a resist layer disposed on said sample.

9. The charged particle beam exposure apparatus according to claim 1, wherein an acceleration voltage of said beam gun is in a range of 1 keV to 8 keV.

10. The charged particle beam exposure apparatus according to claim 1, further comprising a reference mark for correcting a baseline shift on said sample stage.

* * * * *